United States Patent
Lee et al.

(10) Patent No.: US 12,446,220 B2
(45) Date of Patent: Oct. 14, 2025

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Chanmi Lee, Suwon-si (KR); Sangwuk Park, Hwaseong-si (KR); Yejeong Seo, Goyang-si (KR); Sanggyo Chung, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 698 days.

(21) Appl. No.: 17/735,306

(22) Filed: May 3, 2022

(65) Prior Publication Data

US 2023/0084694 A1    Mar. 16, 2023

(30) Foreign Application Priority Data

Sep. 10, 2021    (KR) .......................... 1020210120903

(51) Int. Cl.
*H10B 43/27*    (2023.01)
*H01L 23/528*    (2006.01)
(Continued)

(52) U.S. Cl.
CPC ......... *H10B 43/27* (2023.02); *H01L 23/5283* (2013.01); *H10B 41/10* (2023.02); *H10B 41/27* (2023.02); *H10B 43/10* (2023.02)

(58) Field of Classification Search
CPC ........ H10B 43/27; H10B 41/10; H10B 41/27; H10B 43/10; H10B 12/03; H10B 12/05;
(Continued)

(56) References Cited

U.S. PATENT DOCUMENTS 10,535,659 B2    1/2020    Kim et al.
10,784,272 B2    9/2020    Lee et al.
(Continued)

FOREIGN PATENT DOCUMENTS

KR    10-1992-0017249    9/1992
KR    10-2237739    4/2021
(Continued)

OTHER PUBLICATIONS

Office Action dated May 21, 2025 issued in corresponding Korean Patent Application No. 10-2021-0079517.

*Primary Examiner* — Eva Y Montalvo
*Assistant Examiner* — Nicholas B Michaud
(74) *Attorney, Agent, or Firm* — Morgan, Lewis & Bockius LLP

(57) ABSTRACT

A semiconductor memory device includes a stack structure including word lines and interlayer dielectric patterns that are alternately and repeatedly stacked on a semiconductor substrate. Semiconductor patterns are respectively disposed between vertically adjacent word lines. A bit line vertically extends from the semiconductor substrate and contacts the semiconductor patterns. A capping insulating pattern is disposed between the bit line and the word lines and covers side surfaces of the interlayer dielectric patterns. Memory elements are respectively disposed between vertically adjacent interlayer dielectric patterns. Each of the semiconductor patterns comprises a first source/drain region that contacts the bit line, a second source/drain region that directly contacts one memory element of the memory elements, and a channel region between the first and second source/drain regions. A largest width of the first source/drain region is greater than a width of the channel region.

18 Claims, 49 Drawing Sheets

(51) Int. Cl.
    *H10B 41/10*     (2023.01)
    *H10B 41/27*     (2023.01)
    *H10B 43/10*     (2023.01)

(58) Field of Classification Search
    CPC .. H10B 12/482; H10B 12/488; H01L 23/5283
    USPC ........................................................ 257/359
    See application file for complete search history.

(56)             References Cited

U.S. PATENT DOCUMENTS

| | | |
|---|---|---|
| 11,502,086 B2 | 11/2022 | Son et al. |
| 11,950,406 B2 | 4/2024 | Lee |
| 2015/0364560 A1 * | 12/2015 | Wang .................. H01L 29/7827 |
| | | 257/288 |
| 2020/0227475 A1 * | 7/2020 | Park .................... H10N 70/066 |
| 2020/0279601 A1 | 9/2020 | Kim et al. |
| 2021/0013210 A1 | 1/2021 | Lee et al. |
| 2021/0098421 A1 | 4/2021 | Wu et al. |
| 2021/0159231 A1 | 5/2021 | Lee et al. |
| 2022/0246619 A1 * | 8/2022 | Kim .................. H01L 29/78696 |
| 2022/0271040 A1 * | 8/2022 | Kim ....................... H10B 12/50 |

FOREIGN PATENT DOCUMENTS

| | | |
|---|---|---|
| KR | 10-2021-0077098 A | 6/2021 |
| KR | 10-2021-0098198 A | 8/2021 |

* cited by examiner

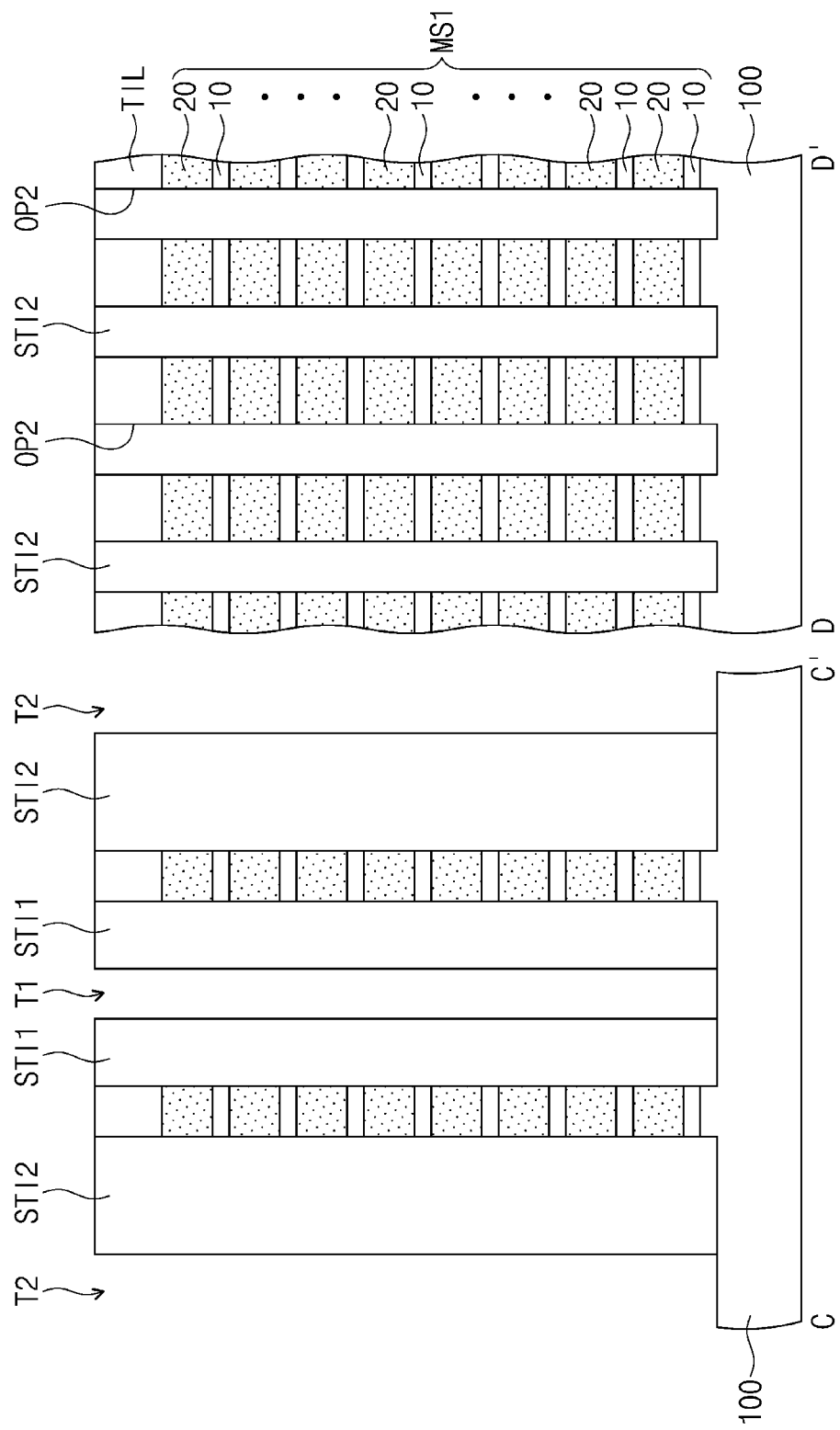

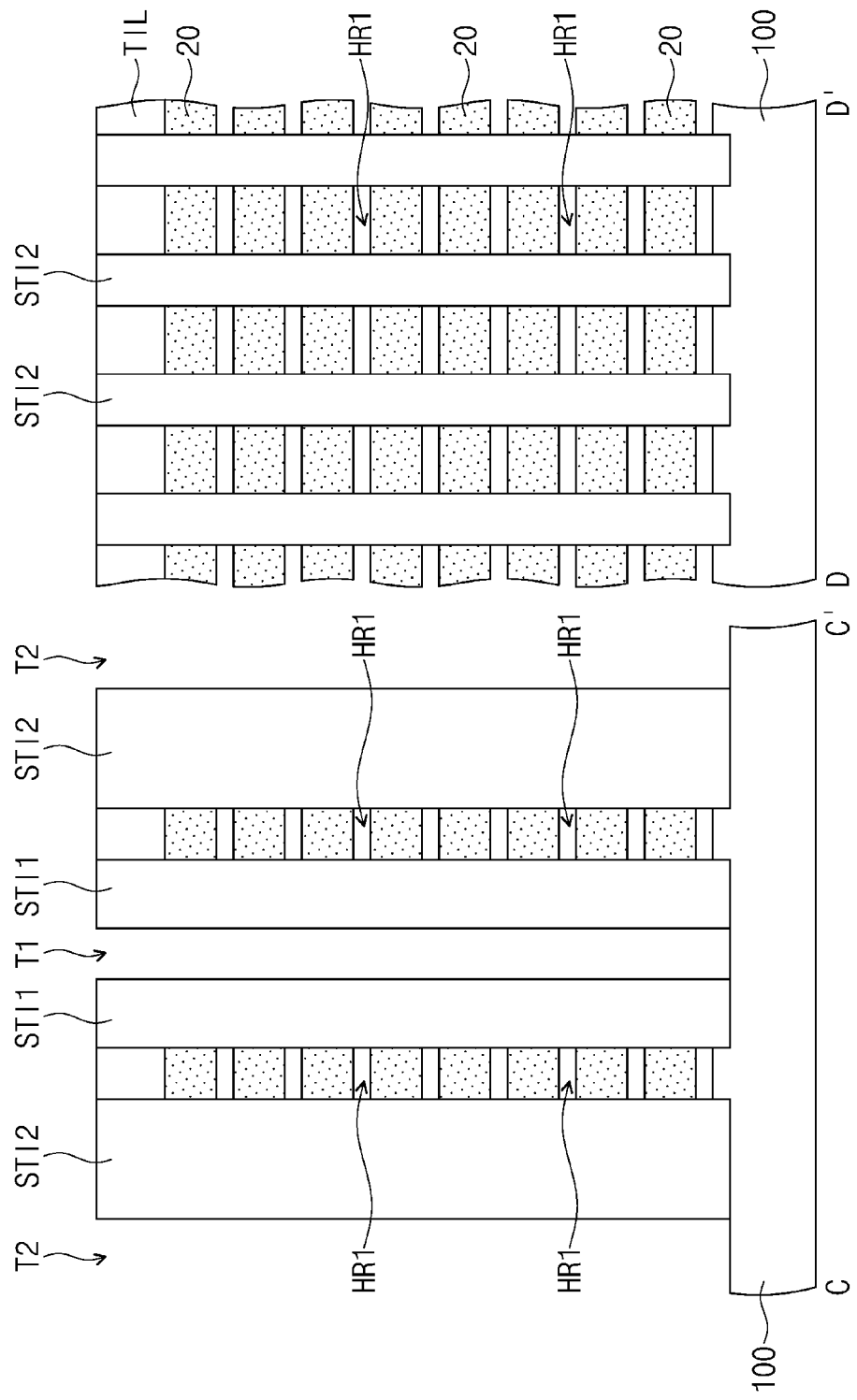

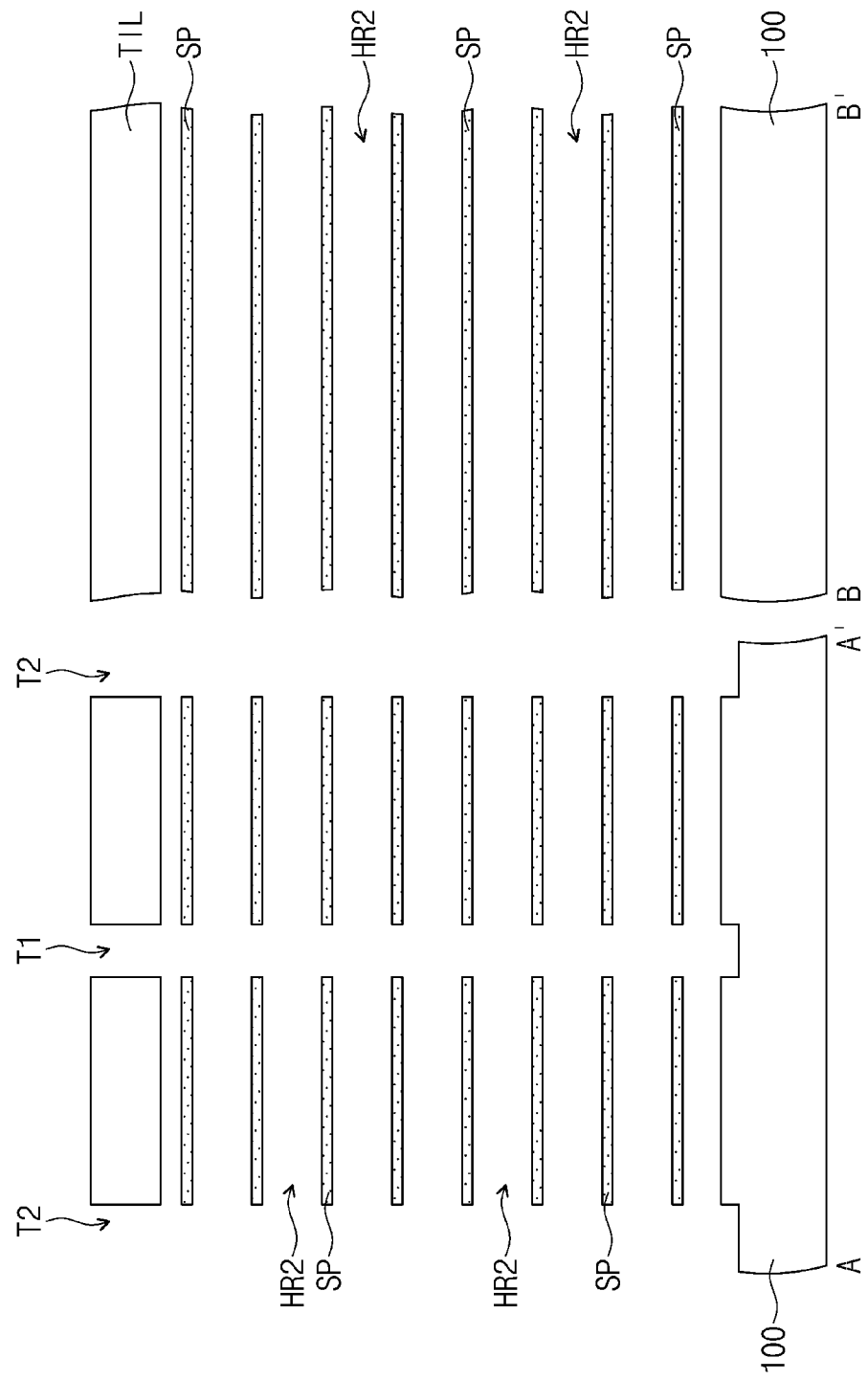

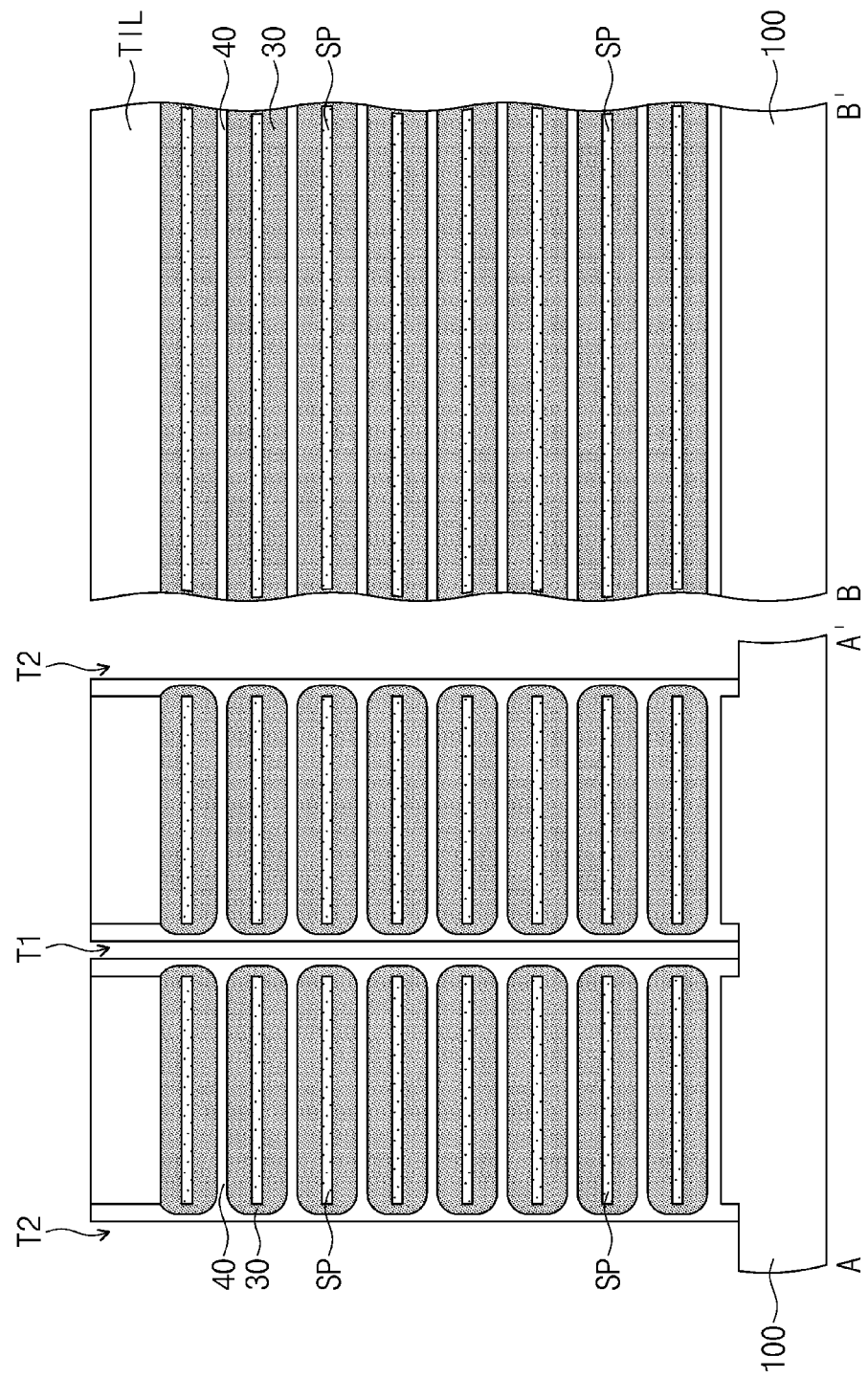

SEMICONDUCTOR MEMORY DEVICE AND METHOD OF FABRICATING THE SAME

CROSS-REFERENCE TO RELATED APPLICATIONS

This application claims priority under 35 U.S.C. § 119 to Korean Patent Application No. 10-2021-0120903, filed on Sep. 10, 2021 in the Korean Intellectual Property Office, the disclosure of which is incorporated by reference in its entirety herein.

1. TECHNICAL FIELD

The present disclosure relates to a semiconductor memory device and a method of fabricating the same, and in particular, to a semiconductor memory device including three-dimensionally arranged memory cells and a method of fabricating the same.

2. DISCUSSION OF RELATED ART

Consumer demand for electronic devices having superior performance and inexpensive prices has led to an increase in the integration of semiconductor devices. In the case of two-dimensional or planar semiconductor devices, since the integration is mainly determined by the area occupied by a unit memory cell, integration is greatly influenced by the level of a fine pattern forming technology. However, increasing pattern fineness requires extremely expensive process equipment which 1 sets a practical limitation on increasing integration for two-dimensional or planar semiconductor devices. Thus, three-dimensional semiconductor memory devices including three-dimensionally arranged memory cells have recently been proposed.

SUMMARY

An embodiment of the present inventive concept provides a semiconductor memory device with increased reliability and electrical characteristics and a method of fabricating the same.

According to an embodiment of the present inventive concept, a semiconductor memory device includes a stack structure including word lines and interlayer dielectric patterns that are alternately and repeatedly stacked on a semiconductor substrate. Semiconductor patterns are respectively disposed between vertically adjacent word lines of the word lines. A bit line vertically extends from the semiconductor substrate and contacts the semiconductor patterns. A capping insulating pattern is disposed between the bit line and the word lines and covers side surfaces of the interlayer dielectric patterns. Memory elements are respectively disposed between vertically adjacent interlayer dielectric patterns of the interlayer dielectric patterns. Each of the semiconductor patterns comprises a first source/drain region that contacts the bit line, a second source/drain region that directly contacts one memory element of the memory elements, and a channel region between the first and second source/drain regions. A largest width of the first source/drain region is greater than a width of the channel region.

According to an embodiment of the present inventive concept, a semiconductor memory device includes a stack structure including word lines and interlayer dielectric patterns that are alternately and repeatedly stacked on a semiconductor substrate. Semiconductor patterns are respectively disposed between vertically adjacent word lines of the word lines. A silicide pattern covers a portion of each of the semiconductor patterns. A bit line vertically extends from the semiconductor substrate and contacts the semiconductor patterns. A capping insulating pattern is disposed between the bit line and the word lines and covers side surfaces of the interlayer dielectric patterns. Storage electrodes are respectively disposed between vertically adjacent interlayer dielectric patterns of the interlayer dielectric patterns. A capacitor dielectric layer conformally covers inner surfaces of the storage electrodes. A plate electrode fills a space enclosed by the capacitor dielectric layer. Each of the semiconductor patterns comprises a first source/drain region that contacts the bit line, a second source/drain region that directly contacts one storage electrode of the storage electrodes, and a channel region between the first and second source/drain regions. The silicide pattern covers a portion of the first source/drain region.

According to an embodiment of the present inventive concept, a semiconductor memory device includes a stack structure including word lines and interlayer dielectric patterns that are alternately stacked on a semiconductor substrate. The word lines extend in a first direction that is parallel to a top surface of the semiconductor substrate. Semiconductor patterns are disposed on the semiconductor substrate to have a long axis extending in a second direction crossing the word lines and are spaced apart from each other in the first direction and a third direction that is perpendicular to the top surface of the semiconductor substrate. Bit lines extend in the third direction and are spaced apart from each other in the first direction. Each of the bit lines contacts first side surfaces of the semiconductor patterns that are spaced apart from each other in the third direction. Capping insulating patterns are disposed between the bit lines and the word lines and extend in the third direction to cover side surfaces of the interlayer dielectric patterns. Memory elements are respectively disposed between vertically adjacent interlayer dielectric patterns of the interlayer dielectric patterns and directly contact second side surfaces of the semiconductor patterns that are opposite to the first side surfaces. First insulating separation patterns are disposed between the bit lines and are spaced apart from each other in the first direction. Second insulating separation patterns are disposed between the memory elements and are spaced apart from each other in the first direction. Each of the semiconductor patterns comprises a first source/drain region that contacts one bit line of the bit lines, a second source/drain region that directly contacts one memory element of the memory elements, and a channel region between the first and second source/drain regions. A largest width of the first source/drain region is larger than a width of the channel region.

BRIEF DESCRIPTION OF THE DRAWINGS

FIGS. 7A to 15A are plan views illustrating a method of fabricating a semiconductor memory device, according to embodiments of the present inventive concept.

FIGS. 7B to 15B are cross-sectional views illustrating a method of fabricating a semiconductor memory device according to embodiments of the present inventive concept and in particular illustrating cross-sections taken along lines A-A' and B-B' of FIGS. 7A to 15A, respectively.

FIGS. 7C to 15C are cross-sectional views illustrating a method of fabricating a semiconductor memory device according to embodiments of the present inventive concept and in particular illustrating cross-sections taken along lines C-C' and D-D' of FIGS. 7A to 15A, respectively.

FIGS. 20A to 24A are plan views illustrating a method of fabricating a semiconductor memory device, according to embodiments of the present inventive concept.

FIGS. 20B to 24B are cross-sectional views illustrating a method of fabricating a semiconductor memory device according to embodiments of the present inventive concept and in particular illustrating cross-sections taken along lines A-A' of FIGS. 20A to 24A, respectively.

DETAILED DESCRIPTION OF EMBODIMENTS

Example embodiments of the present inventive concept will now be described more fully with reference to the accompanying drawings, in which non-limiting embodiments are shown.

Figure 1:
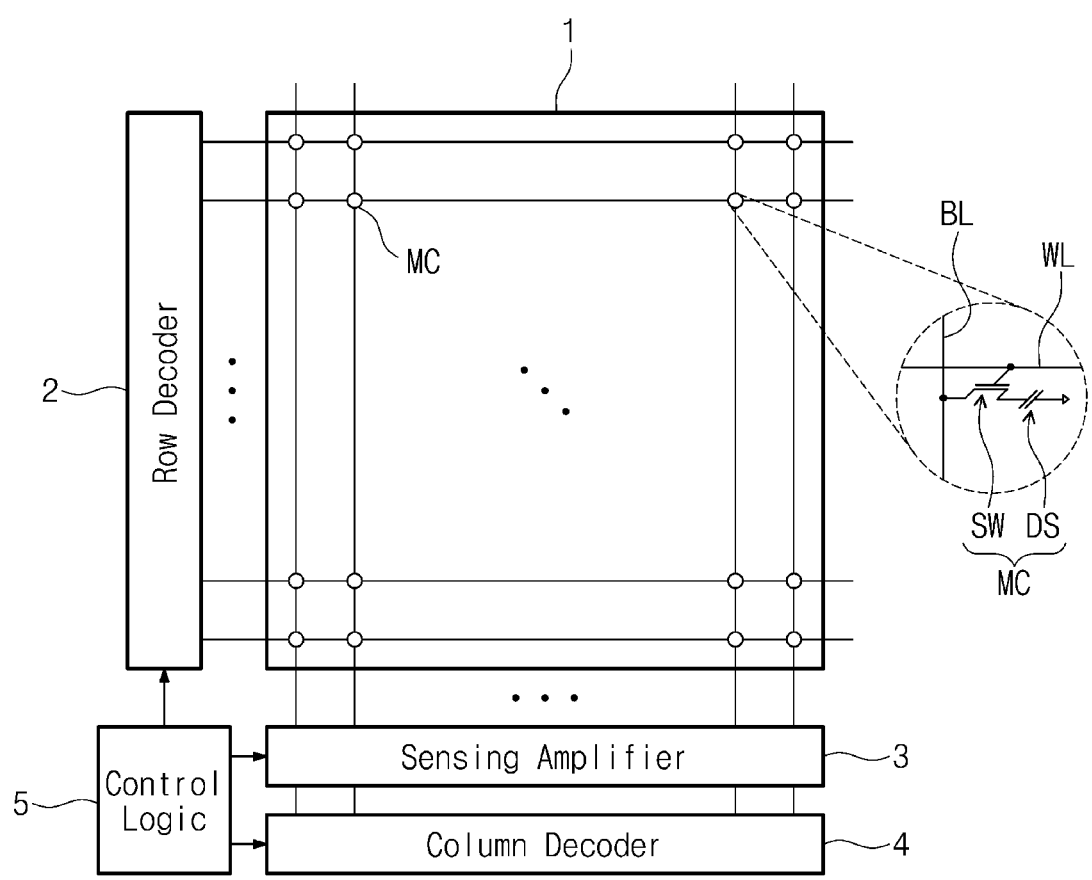
FIG. 1 is a diagram schematically illustrating a cell array of a semiconductor memory device according to an embodiment of the present inventive concept.

FIG. 1 is a diagram schematically illustrating a cell array of a semiconductor memory device according to an embodiment of the present inventive concept.

Referring to FIG. 1, a semiconductor memory device according to an embodiment of the present inventive concept may include a memory cell array 1, a row decoder 2, a sensing amplifier 3, a column decoder 4, and a control logic 5.

The memory cell array 1 may include a plurality of memory cells MC, which are three-dimensionally arranged. Each of the memory cells MC may be disposed between and connected to a word line WL and a bit line BL crossing each other.

Each of the memory cells MC may include a selection element SW and a memory element DS, which are electrically connected to each other in series. The memory element DS may be disposed between and connected to the bit line BL and the selection element SW, and the selection element SW may be disposed between and connected to the memory element DS and the word line WL. In an embodiment, the selection element SW may be a field effect transistor (FET), and the memory element DS may be realized with a capacitor, a variable resistor, or the like. As an example, the selection element SW may include a transistor having a gate electrode, which is connected to the word line WL, and drain/source terminals, which are respectively connected to the bit line BL and the memory element DS.

The row decoder 2 may be configured to decode address information, which is input from the outside, and to select one of the word lines WL of the memory cell array 1, based on the decoded address information. The address information decoded by the row decoder 2 may be provided to a row driver, and in this embodiment, the row driver may provide respective voltages to the selected one and unselected ones of the word lines WL, in response to the control of a control circuit.

The sensing amplifier 3 may be configured to sense, amplify, and output a difference in voltage between one of the bit lines BL, which is selected based on address information decoded by the column decoder 4, and a reference bit line.

The column decoder 4 may provide a data transmission path between the sensing amplifier 3 and an external device (e.g., a memory controller). The column decoder 4 may be configured to decode address information, which is input from the outside, and to select one of the bit lines BL, based on the decoded address information.

The control logic 5 may be configured to generate control signals, which are used to control data-writing or data-reading operations on the memory cell array 1.

Figure 2:
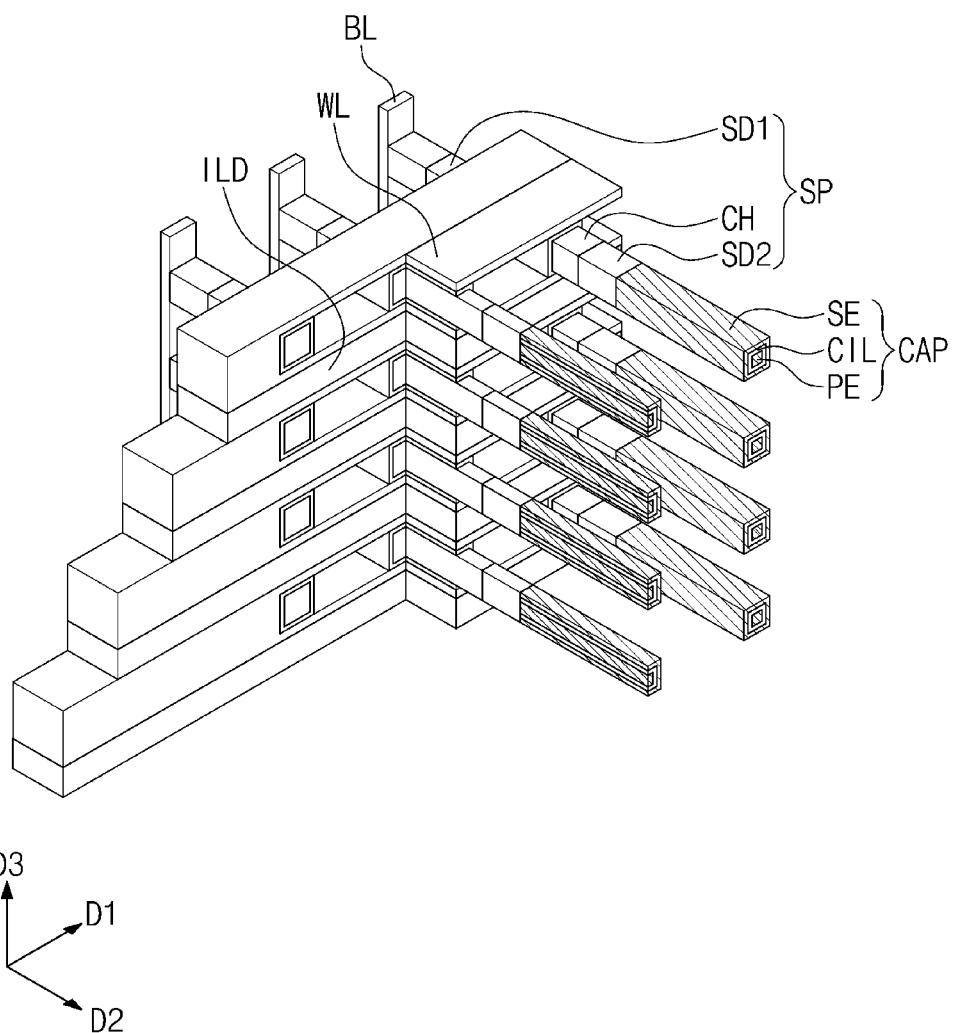
FIG. 2 is a perspective view illustrating a portion of a cell array of a semiconductor memory device according to an embodiment of the present inventive concept.
Figure 3A:
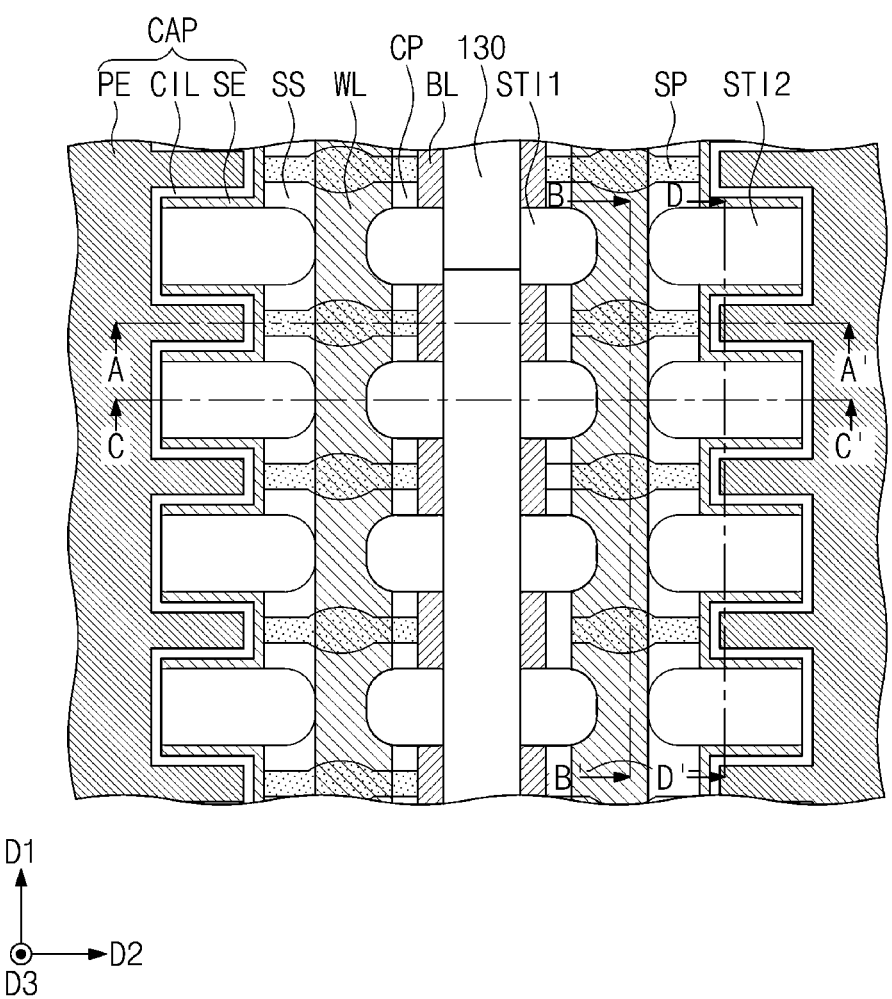
FIG. 3A is a plan view illustrating a semiconductor memory device according to an embodiment of the present inventive concept.
Figure 3B:
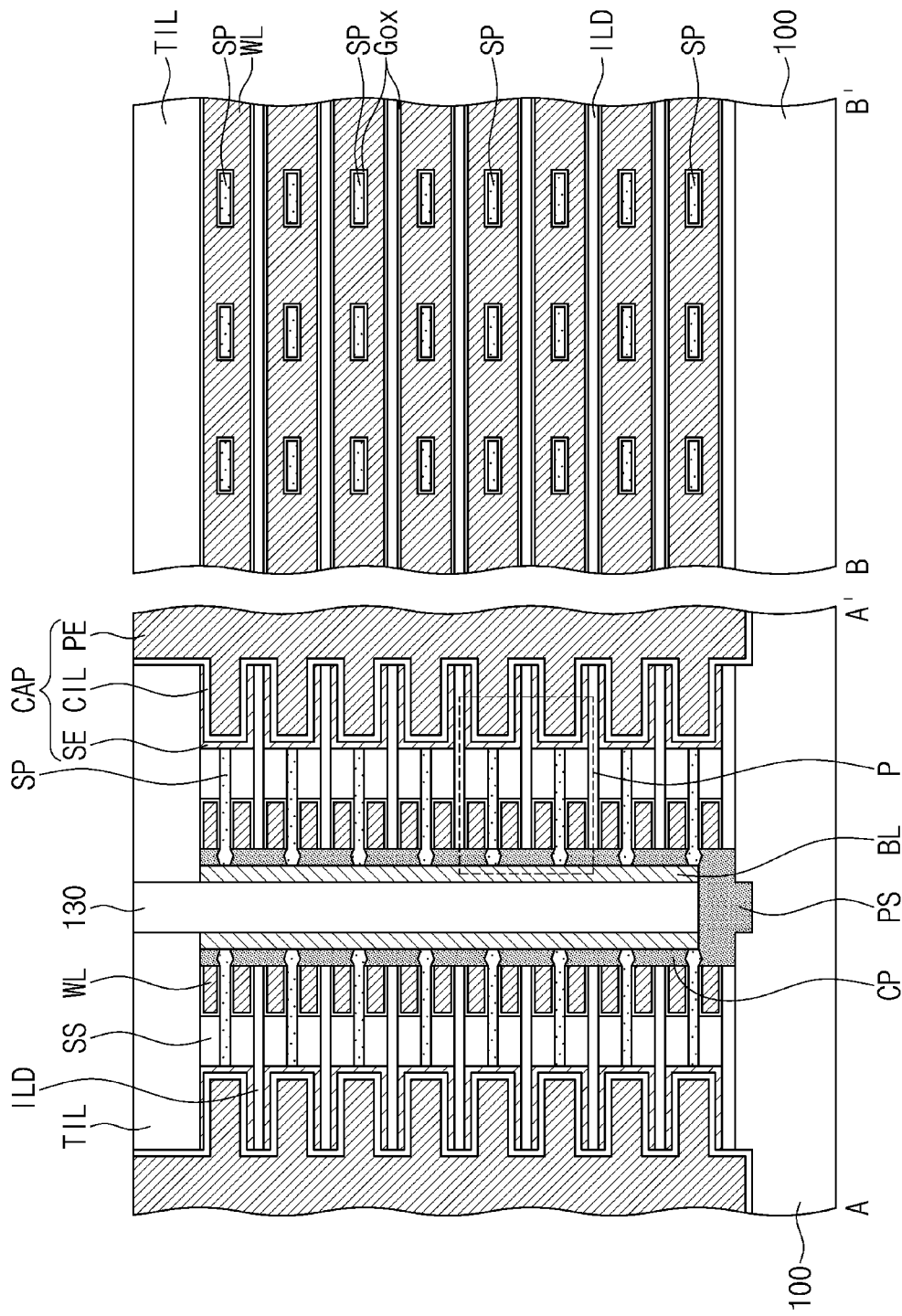
FIG. 3B is a cross-sectional view illustrating a semiconductor memory device according to an embodiment of the present inventive concept and in particular illustrating cross-sections taken along lines A-A' and B-B' of FIG. 3A.
Figure 3C:
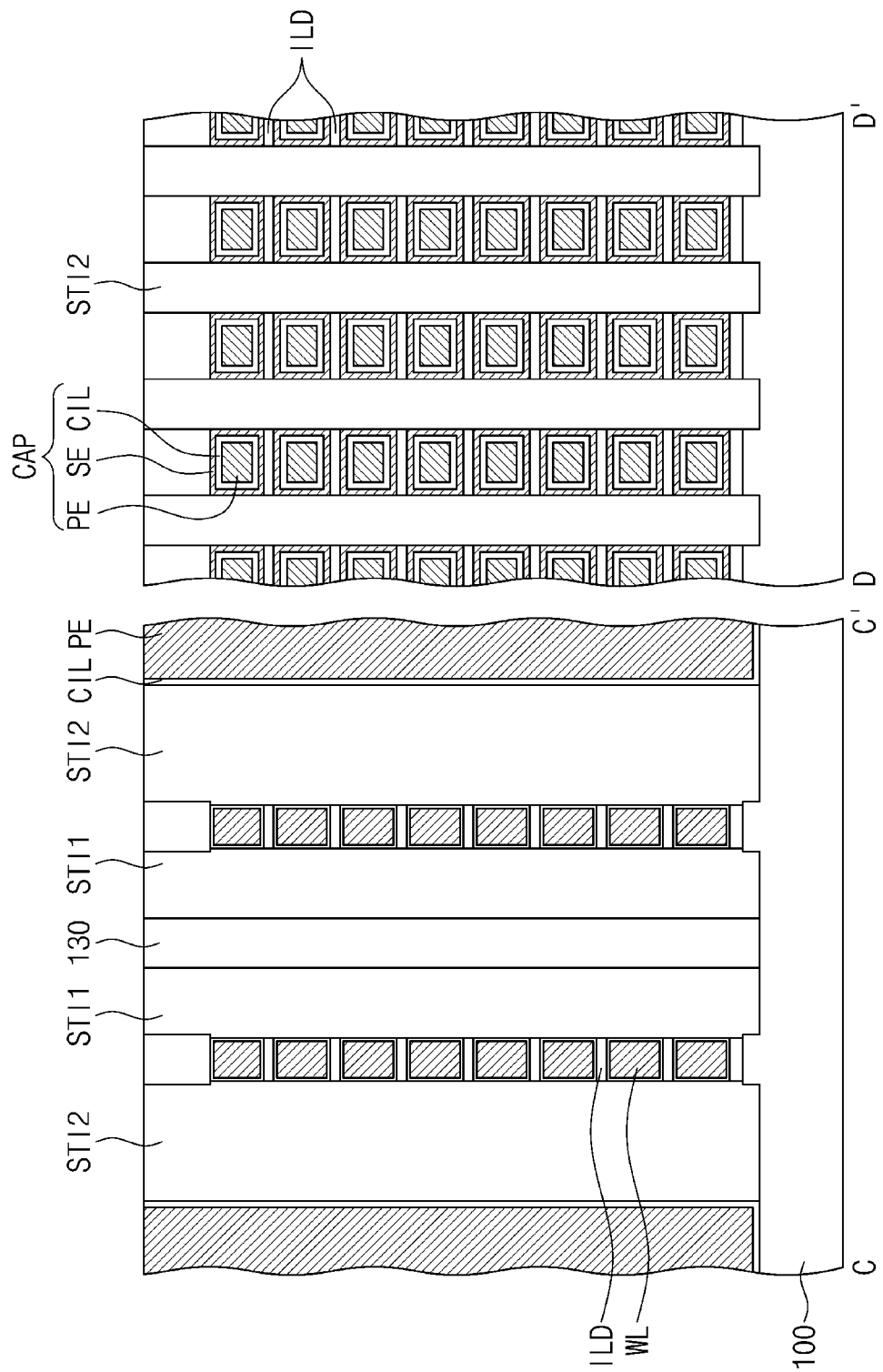
FIG. 3C is a cross-sectional view illustrating a semiconductor memory device according to an embodiment of the present inventive concept and in particular illustrating cross-sections taken along lines C-C' and D-D' of FIG. 3A.

FIG. 2 is a perspective view illustrating a portion of a cell array of a semiconductor memory device according to an embodiment of the present inventive concept. FIG. 3A is a plan view illustrating a semiconductor memory device according to an embodiment of the present inventive concept. FIG. 3B is a cross-sectional view illustrating a semiconductor memory device according to an embodiment of the present inventive concept and in particular illustrating cross-sections taken along lines A-A' and B-B' of FIG. 3A. FIG. 3C is a cross-sectional view illustrating a semiconductor memory device according to an embodiment of the present inventive concept and in particular illustrating cross-sections taken along lines C-C' and D-D' of FIG. 3A.

Referring to FIGS. 2, 3A, 3B, and 3C, a semiconductor memory device according to an embodiment of the present inventive concept may include a semiconductor substrate 100 and first and second stack structures, which are disposed on the semiconductor substrate 100. A top surface of the semiconductor substrate 100 may be normal to a third direction D3 that is not parallel to a first direction D1 and a second direction D2. For example, in an embodiment, the first, second, and third directions D1, D2, and D3 may be orthogonal to each other. Each of the first and second stack structures may include word lines WL, which extend in the first direction D1 and are stacked on the semiconductor substrate 100 with interlayer dielectric patterns ILD interposed therebetween (e.g., in the third direction D3).

The word lines WL and the interlayer dielectric patterns ILD may be alternately and repeatedly stacked in the third direction D3 that is orthogonal to the first and second directions D1 and D2. Each of the word lines WL may include a line portion, which extends in the first direction D1 parallel to the top surface of the semiconductor substrate 100, and gate electrode portions, which extend from the line portion to protrude in the second direction D2. For example, the line portion may be disposed between first and second insulating separation patterns STI1 and STI2. When viewed in a plan view, a pair of the word lines WL may be provided to have mirror symmetry about a plate electrode PE.

Semiconductor patterns SP may be stacked in the third direction D3 and may be spaced apart from each other in the first and second directions D1 and D2. For example, the semiconductor patterns SP may be three-dimensionally arranged on the semiconductor substrate 100. The semiconductor patterns SP may be formed of or include at least one compound selected from silicon and germanium. For example, the semiconductor patterns SP may be formed of or include single-crystalline silicon. However, embodiments of the present inventive concept are not necessarily limited thereto.

Each of the semiconductor patterns SP may be a bar-shaped pattern that is elongated in the second direction D2. Each of the semiconductor patterns SP may include first and second source/drain regions SD1 and SD2, which are spaced apart from each other, and a channel region CH, which is provided between the first and second source/drain regions SD1 and SD2 (e.g., in the second direction D2). The first and second source/drain regions SD1 and SD2 of each of the semiconductor patterns SP may be doped with impurities.

The semiconductor patterns SP may penetrate the word lines WL in the second direction D2. Each of the word lines WL has a structure (e.g., gate-all-around structure) fully surrounding the channel region CH of each of the semiconductor patterns SP. The semiconductor patterns SP may be respectively disposed between vertically adjacent word lines WL (e.g., in the third direction D3). A gate insulating layer Gox may be interposed between the channel region CH of each of the semiconductor patterns SP and the word lines WL. The gate insulating layer Gox may be in direct contact with a side surface of a capping insulating pattern CP. The gate insulating layer Gox may not be in direct contact with the first source/drain region SD1 of each of the semiconductor patterns SP. A side surface of the gate insulating layer Gox may be aligned with side surfaces of the word lines WL.

The capping insulating pattern CP may be disposed at a side of each of the word lines WL to surround the first source/drain region SD1 of each of the semiconductor patterns SP, and a spacer insulating pattern SS may be disposed at an opposite side of each of the word lines WL to surround the second source/drain region SD2 of each of the semiconductor patterns SP. The capping insulating pattern CP may directly contact the side surfaces of the word lines WL. The spacer insulating pattern SS may be spaced apart from each of the word lines WL by the gate insulating layer Gox interposed therebetween.

A first side surface of each of the semiconductor patterns SP may directly contact one of the bit lines BL, and a second side surface of each of the semiconductor patterns SP that is opposite to the first side surface (e.g., in the second direction D2) may directly contact one of the storage electrodes SE. The bit lines BL may extend in the third direction D3 to cross the word lines WL. In an embodiment, the bit lines BL may have substantially the same length in the third direction D3. The bit lines BL may be arranged to be spaced apart from each other in the first and second directions D1 and D2. Each of the bit lines BL may be connected to the first source/drain regions SD1 of the semiconductor patterns SP which are stacked in the third direction D3.

A memory element may be connected to the second source/drain region SD2 of each of the semiconductor patterns SP. In an embodiment, the memory element may include a capacitor CAP, and the storage electrodes SE of the capacitor CAP may be respectively connected to the second source/drain regions SD2 of the semiconductor patterns SP.

Each of the storage electrodes SE may be disposed at substantially the same level as a corresponding one of the semiconductor patterns SP. For example, the storage electrodes SE may be stacked in the third direction D3 and may have a shape that is elongated in the second direction D2. The storage electrodes SE may be respectively disposed between adjacent interlayer dielectric patterns ILD which are vertically adjacent to each other (e.g., in the third direction D3).

The semiconductor substrate 100 may have a first recess region between the bit lines BL which are spaced apart from each other in the second direction D2. The semiconductor substrate 100 may have a second recess region between the storage electrodes SE which are spaced apart from each other in the second direction D2. Each of the first and second recess regions may extend in the first direction D1. A lower protection pattern PS may be disposed in the first recess region.

A capacitor dielectric layer CIL may be disposed to conformally cover surfaces of the storage electrodes SE. The capacitor dielectric layer CIL may be disposed between the storage electrodes SE and the plate electrode PE. The plate electrode PE may fill an inner space of each of the storage electrodes SE. The plate electrode PE may cover inner surfaces of the storage electrodes SE.

Figure 4:
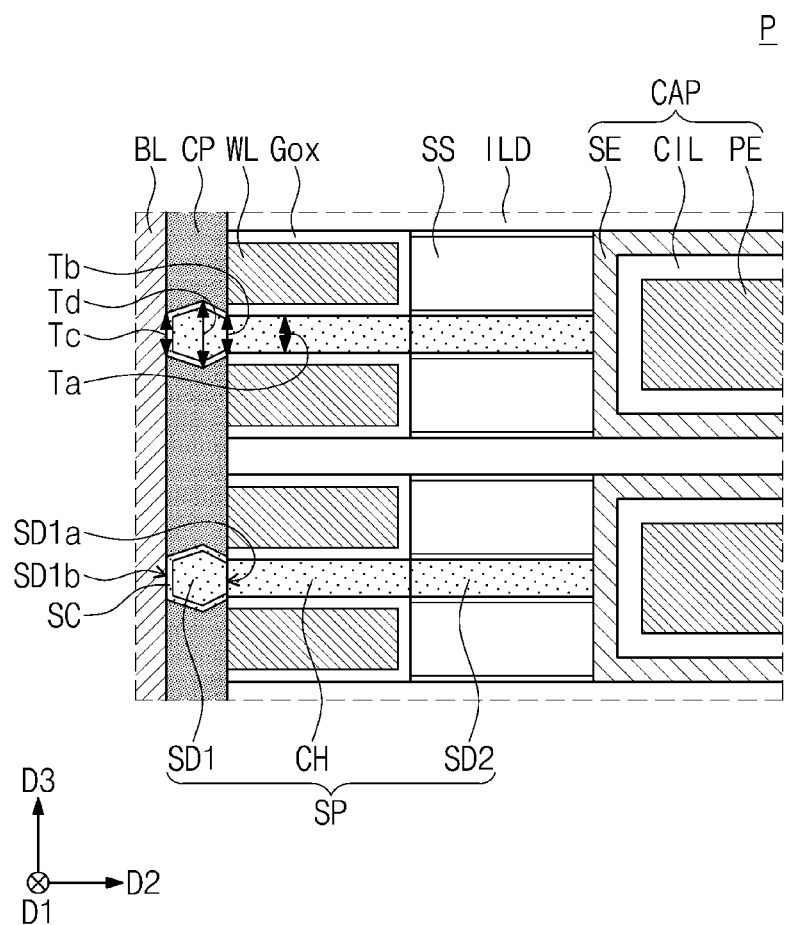
FIGS. 4 to 6 are enlarged cross-sectional views illustrating a portion of a semiconductor memory device according to embodiments of the present inventive concept and in particular illustrating a portion P of FIG. 3B.

FIG. 4 is an enlarged cross-sectional view illustrating a portion of a semiconductor memory device according to an embodiment of the present inventive concept and in particular illustrating a portion 'P' of FIG. 3B.

The semiconductor patterns SP including the first and second source/drain regions SD1 and SD2 and the channel region CH therebetween will be described in more detail with reference to FIG. 4. Hereinafter, one of the semiconductor patterns SP, one of the word lines WL, and one of the bit lines BL will be described for convenience in description but the others of the semiconductor patterns SP, the others of the word lines WL, and the others of the bit lines BL may also have substantially the same features as those described below.

A silicide pattern SC may be disposed to cover the first source/drain region SD1 and to directly contact the bit line BL. The silicide pattern SC may not be disposed on a first side surface SD1a of the first source/drain region SD1. For example, in an embodiment as shown in FIG. 4 the silicide pattern SC may not be interposed between the first source/drain region SD1 and the channel region CH. The silicide pattern SC may conformally cover a top surface, a bottom surface, and a second side surface SD1b of the first source/drain region SD1. The first source/drain region SD1 may be electrically connected to the bit line BL through the silicide pattern SC. The silicide pattern SC may be electrically separated (e.g., electrically isolated) from the word lines WL by the capping insulating pattern CP interposed therebetween. The silicide pattern SC may be formed of or include at least one of metal-silicide materials. Hereinafter, an example in which the first source/drain region SD1 includes the silicide pattern SC will be described.

The channel region CH may have a first width Ta in the third direction D3. For example, in an embodiment as shown in FIG. 4, an entirety of the channel region CH may have the first width Ta in the third direction D3. A width of the first source/drain region SD1 in the third direction D3 may be changed as a distance from the channel region CH is increased. A first end portion of the first source/drain region SD1 that directly contacts the channel region CH may have a second width Th in the third direction D3. A second end portion of the first source/drain region SD1 adjacent to the bit line BL and indirectly contacting the bit line BL via the silicide pattern SC may have a third width Te in the third direction D3. Here, the first and second end portions of the first source/drain region SD1 may be opposite to each other in the second direction D2. A center portion of the first source/drain region SD1 (e.g., between the opposite first and second end portions in the second direction D2) may have a fourth width Td in the third direction D3. In an embodiment, the second width Tb may be greater than or equal to the first width Ta. The fourth width Td may be greater than the second width Tb and the third width Te. As a distance in the second direction D2 is increased, the width of the first source/drain region SD1 in the third direction D3 may be increased to the maximum value and may then be decreased after the maximum value. For example, the first source/drain region SD1 may have a polygonal shape, when viewed in a cross-sectional view. The first source/drain region SD1 may be electrically disconnected from the word line WL.

The capping insulating pattern CP may be disposed to cover top and bottom surfaces of the first source/drain region SD1, a side surface of the bit line BL, a side surface of the word line WL, and a side surface of the interlayer dielectric pattern ILD. For example, the bit line BL may be spaced apart from the interlayer dielectric pattern ILD with the capping insulating pattern CP interposed therebetween. In an embodiment, the capping insulating pattern CP may have opposite side surfaces that extend in the third direction D3 to be parallel to each other. Each of the opposite side surfaces of the capping insulating pattern CP may be aligned to the first or second side surface SD1a or SD1b of the first source/drain region SD1 In an embodiment, the opposite side surfaces of the capping insulating pattern CP may be substantially perpendicular to a top surface of the semiconductor substrate 100.

Figure 5:
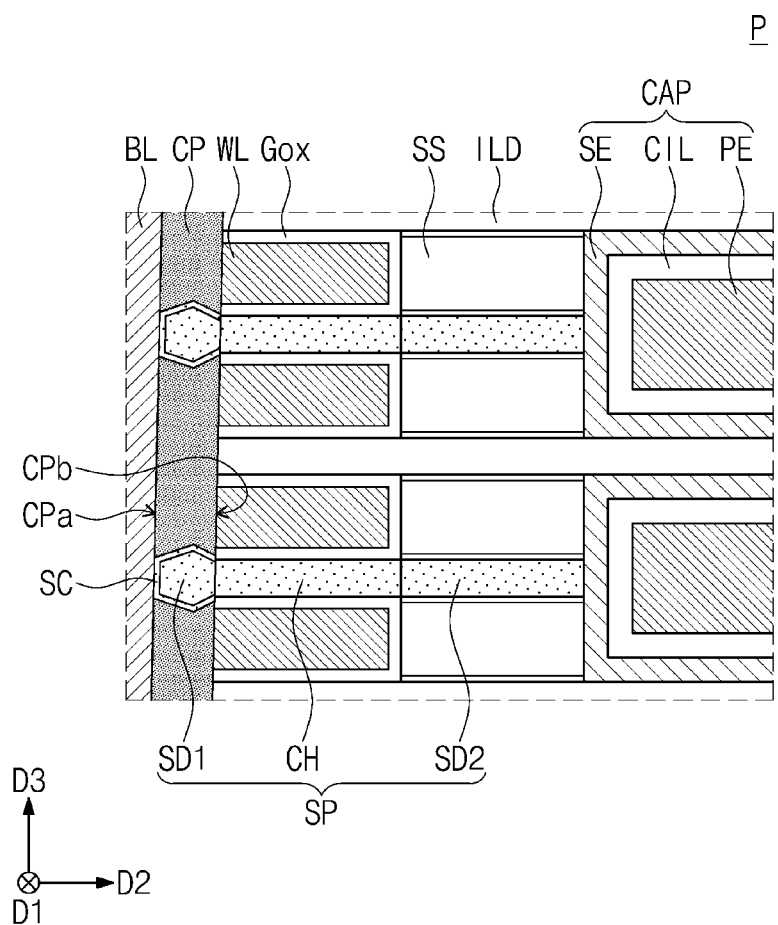

FIG. 5 is an enlarged cross-sectional view illustrating a portion of a semiconductor memory device according to an embodiment of the present inventive concept and in particular illustrating the portion 'P' of FIG. 3B. In the following description, an element previously described with reference to FIG. 4 may be identified by the same reference number without repeating an overlapping description thereof, for concise description.

Figure 6:
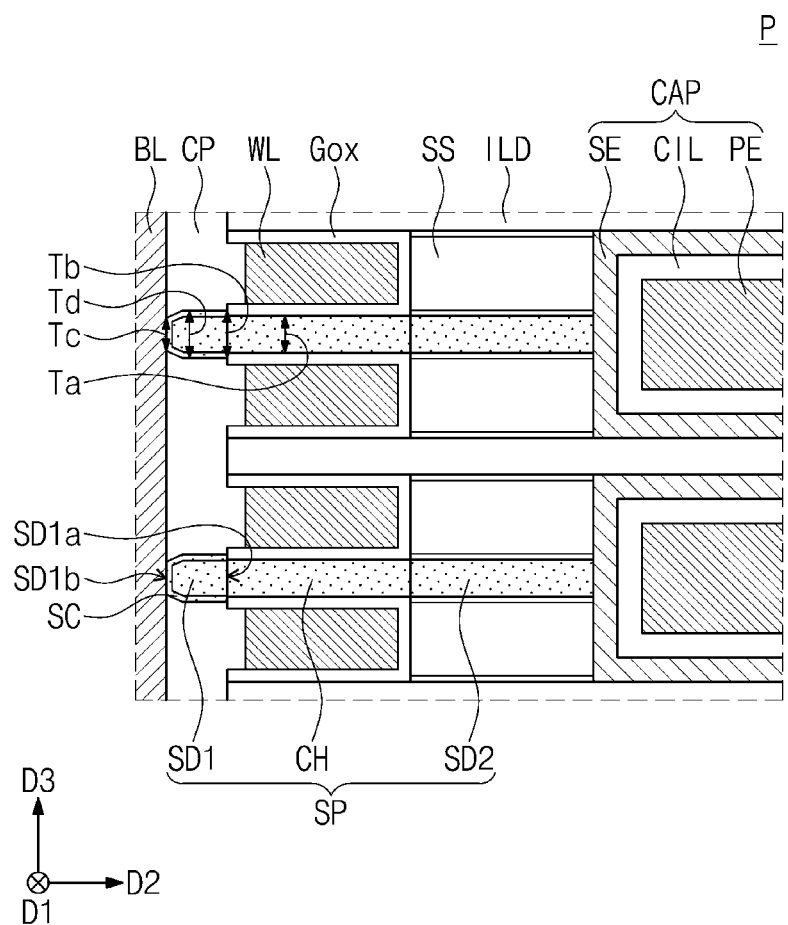

Referring to FIG. 5, the capping insulating pattern CP may have a first side surface CPa and a second side surface CPb that are inclined relative to the third direction D3. For example, the first and second side surfaces CPa, CPb of the capping insulating pattern CP may extend obliquely with respect to the first and second directions D1, D2. A width of the capping insulating pattern CP in the second direction D2 (e.g., a horizontal direction) may be maintained to a constant value even when a vertical level in the third direction D3 is changed. The first side surface CPa of the capping insulating pattern CP may directly contact a side surface of the bit line BL, and the second side surface CPb of the capping insulating pattern CP may directly contact a first side surface of the word line WL and a side surface of the interlayer dielectric pattern ILD. The first side surface of the word line WL adjacent to the capping insulating pattern CP may be inclined at an angle relative to the opposite second side surface of the word line WL, FIG. 6 is an enlarged cross-sectional view illustrating a portion of a semiconductor memory device according to an embodiment of the present inventive concept and in particular illustrating the portion 'P' of FIG. 3B. In the following description, an element previously described with reference to FIG. 4 may be identified by the same reference number without repeating an overlapping description thereof, for concise description.

Referring to FIG. 6, the capping insulating pattern CP may include a protruding portion protruding toward the word line WL (e.g., in the second direction D2). Top and bottom surfaces of the protruding portion of the capping insulating pattern CP may be covered with the gate insulating layer Gox. The protruding portion of the capping insulating pattern CP may be overlapped with the channel region CH of the semiconductor pattern SP and the interlayer dielectric pattern ILD in the third direction D3.

The channel region CH may have the first width Ta in the third direction D3. The first end portion of the first source/drain region SD1 may have the second width Tb in the third direction D3. The second end portion of the first source/drain region SD1 may have the third width Te in the third direction D3. The first and second end portions of the first source/drain region SD1 may be opposite to each other in the second direction D2. A center portion of the first source/drain region SD1 (e.g., between the opposite first and second end portions in the second direction D2) may have the fourth width Td in the third direction D3. The third width Te may be less than the second width Tb and the fourth width Td. For example, an area of the first side surface SD1a of the first source/drain region SD1 may be greater than an area of the second side surface SD1b of the first source/drain region SD1. The second width Tb and the fourth width Td may be greater than or equal to the first width Ta. The first source/drain region SD1 may be electrically disconnected from the word line WL.

Figure 16:
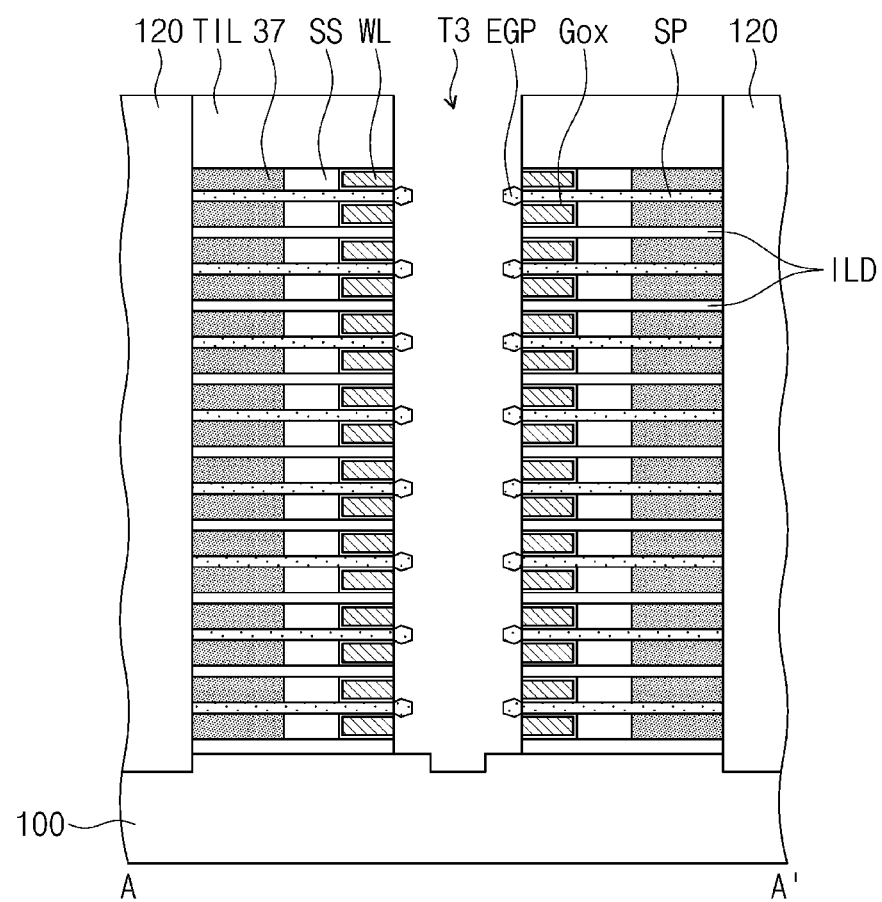
FIGS. 16 and 17 are cross-sectional views illustrating a method of fabricating a semiconductor memory device according to embodiments of the present inventive concept and in particular illustrating a cross-section taken along the line A-A' of FIG. 15A.
Figure 17:
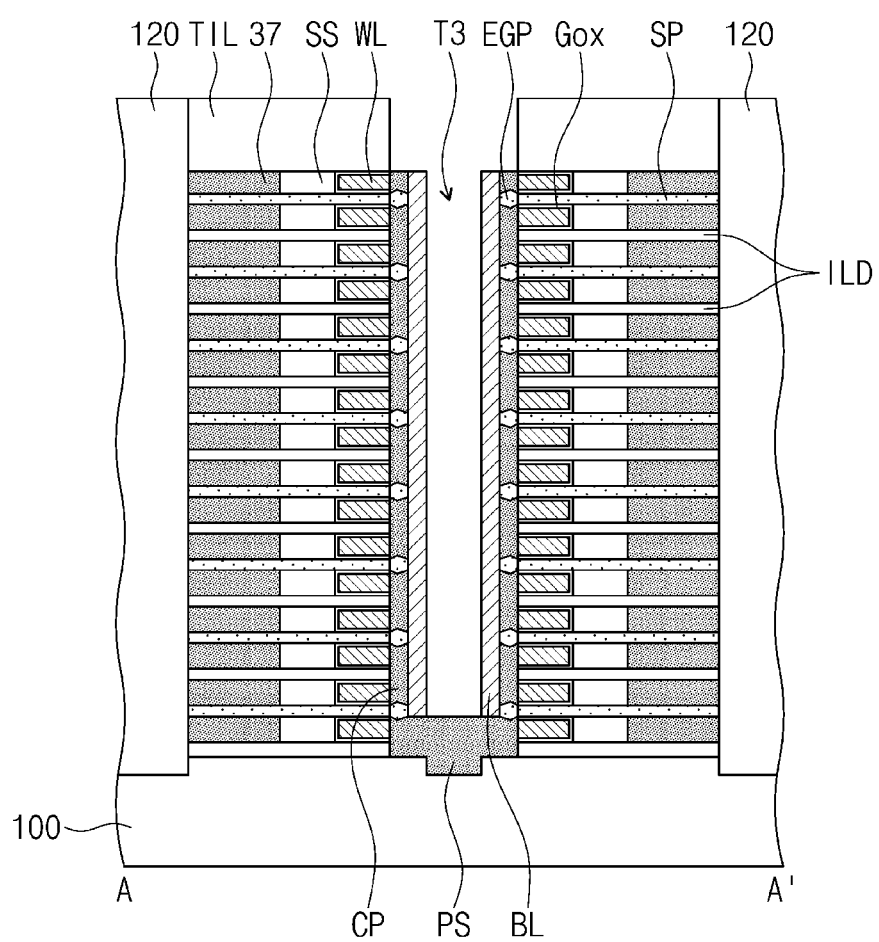

FIGS. 7A to 15A are plan views illustrating a method of fabricating a semiconductor memory device, according to embodiments of the present inventive concept. FIGS. 7B to 15B are cross-sectional views illustrating a method of fabricating a semiconductor memory device according to embodiments of the present inventive concept and in particular illustrating cross-sections taken along lines A-A' and B-B' of FIGS. 7A to 15A, respectively. FIGS. 7C to 15C are cross-sectional views illustrating a method of fabricating a semiconductor memory device according to embodiments of the present inventive concept and in particular illustrating cross-sections taken along lines C-C and D-D' of FIGS. 7A to 15A, respectively. FIGS. 16 and 17 are cross-sectional views illustrating a method of fabricating a semiconductor memory device according to embodiments of the present inventive concept and in particular illustrating a cross-section taken along the line A-A' of FIG. 15A.

Hereinafter, a method of fabricating a semiconductor memory device according to embodiments of the present inventive concept will be described in more detail with reference to FIGS. 7A to 15C, 16, and 17.

Figure 7A:
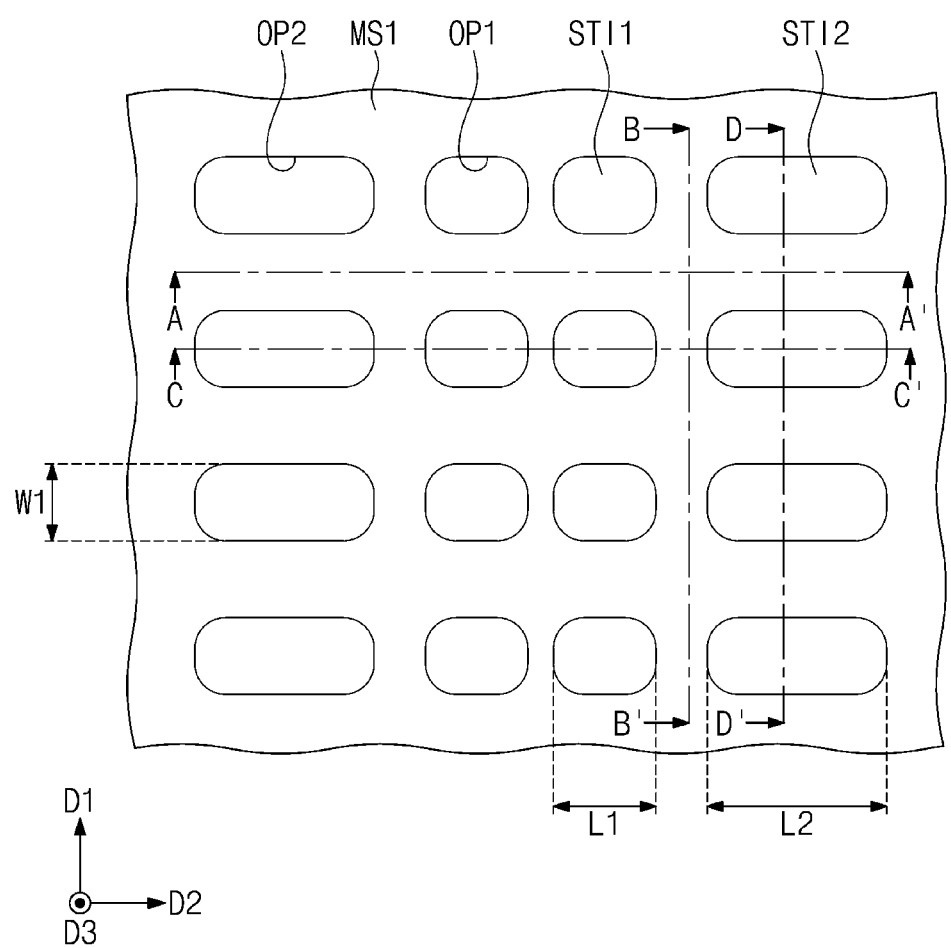
Figure 7B:
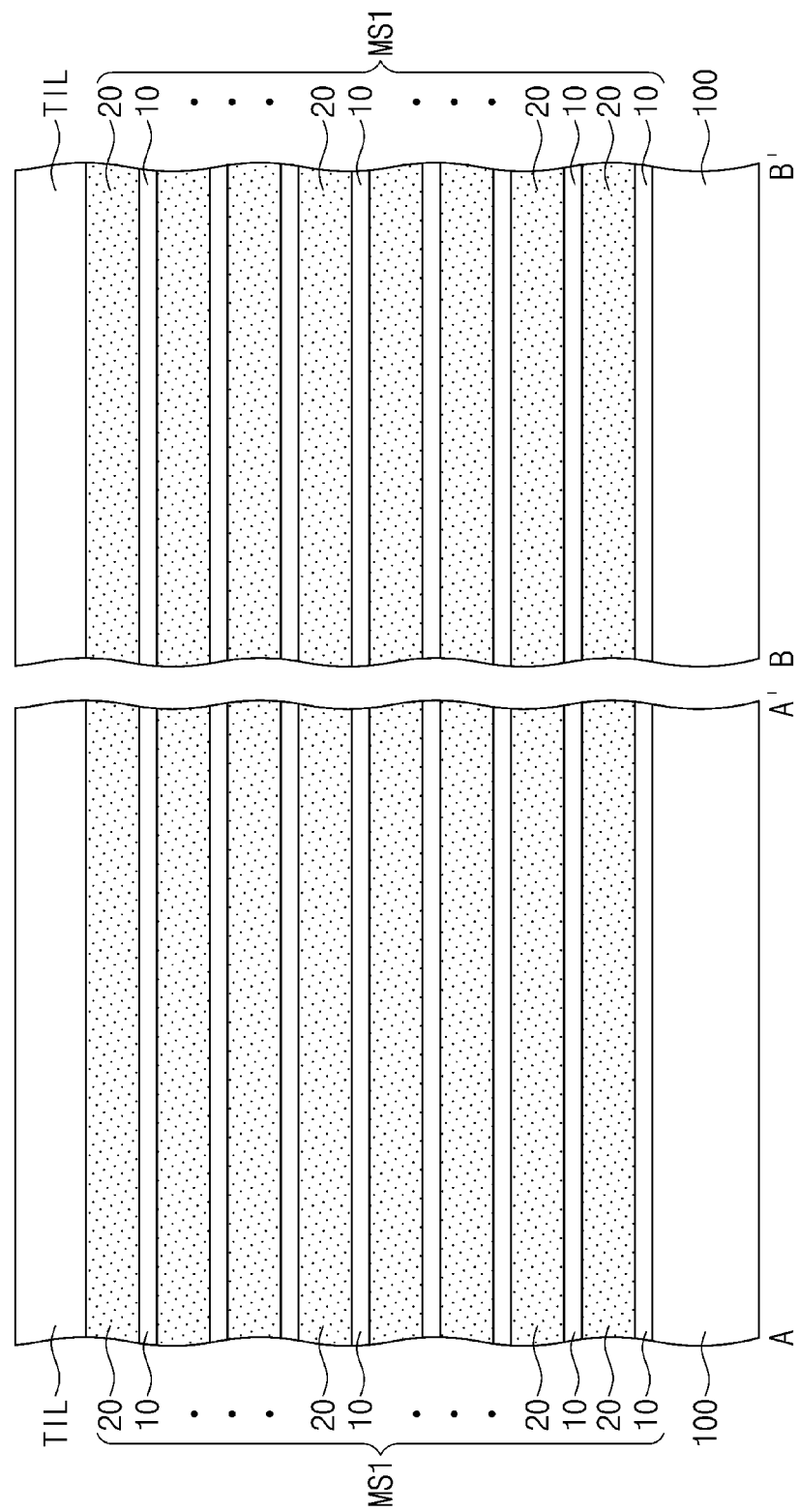
Figure 7C:
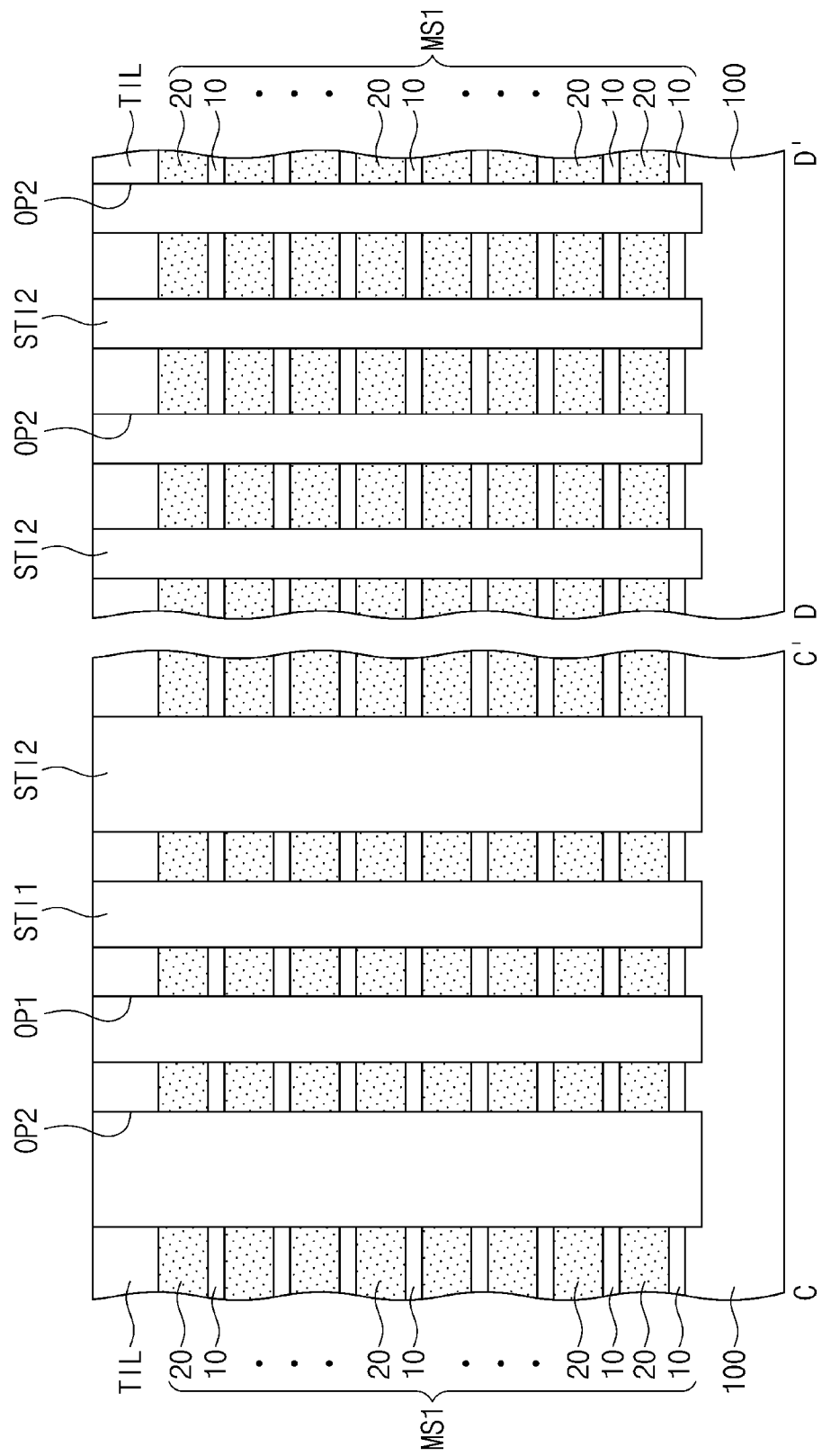

Referring to FIGS. 7A, 7B, and 7C, a first mold structure MS1 may be formed, and in an embodiment, the first mold structure MS1 may include first sacrificial layers 10 and semiconductor layers 20, which are alternately and repeatedly stacked on the semiconductor substrate 100 (e.g., in the third direction D3).

The first sacrificial layers 10 may be formed of a material having an etch selectivity with respect to the semiconductor layers 20. For example, in an embodiment, the first sacrificial layers 10 may be formed of at least one compound selected from silicon germanium, silicon oxide, silicon nitride, and silicon oxynitride. However, embodiments of the present inventive concept are not necessarily limited thereto. When the first mold structure MS1 is formed, each of the first sacrificial layers 10 may be formed to have a thickness that is smaller than a thickness of each of the semiconductor layers 20.

In an embodiment, the semiconductor layers 20 may be formed of at least one compound selected from silicon, germanium, silicon-germanium, and indium gallium zinc oxide (IGZO). However, embodiments of the present inventive concept are not necessarily limited thereto. In an embodiment, the semiconductor layers 20 may be formed of the same semiconductor material as the semiconductor substrate 100. For example, each of the semiconductor layers 20 may be a single-crystalline silicon layer or a poly-crystalline silicon layer.

In an embodiment, the first sacrificial layers 10 and the semiconductor layers 20 may be formed by an epitaxial growth process. The semiconductor layers 20 may be single-crystalline silicon layers, and each of the first sacrificial layers 10 may be a silicon germanium layer having a super lattice structure.

An upper insulating layer TIL may be formed on the first mold structure MS1 to cover the uppermost one of the semiconductor layers 20. The upper insulating layer TIL may be formed of an insulating material that has an etch selectivity with respect to the first sacrificial layers 10 and the semiconductor layers 20. For example, in an embodiment, the upper insulating layer TIL may be formed of silicon oxide. However, embodiments of the present inventive concept are not necessarily limited thereto.

Next, the upper insulating layer TIL and the first mold structure MS1 may be patterned to form first and second openings OP1 and OP2 exposing the semiconductor substrate 100.

The formation of the first and second openings OP1 and OP2 may include forming a mask pattern, which has openings corresponding to the first and second openings OP1 and OP2, on the first mold structure MS1 and anisotropically etching the first mold structure MS1 using the mask pattern as an etch mask.

The first and second openings OP1 and OP2 may be formed to expose the top surface of the semiconductor substrate 100, and in an embodiment in which the anisotropic etching process is performed in an over-etch manner, the top surface of the semiconductor substrate 100 below the first and second openings OP1 and OP2 may be vertically recessed.

The first openings OP1 may be spaced apart from each other in the first direction D1. The second openings OP2 may be spaced apart from each other in the first direction D1 and may be spaced apart from the first openings OP1 in the second direction D2. In an embodiment, a pair of the second openings OP2 may be formed between a pair of the first openings OP1.

The first and second openings OP1 and OP2 may be spaced apart from each other in the first direction D1 by a first distance. The first openings OP1 may be spaced apart from the second openings OP2 in the second direction D2 by a second distance that is less than the first distance.

Each of the first and second openings OP1 and OP2 may have a first width WI in the first direction D1. When measured in the second direction D2, the first openings OP1 may have a first length L1, and the second openings OP2 may have a second length L2 that is greater than the first length L1.

Next, the first and second openings OP1 and OP2 may be filled with the first and second insulating separation patterns STI1 and STI2, respectively.

The first and second insulating separation patterns STI1 and STI2 may directly contact the semiconductor substrate 100. In an embodiment, the first and second insulating separation patterns STI1 and STI2 may be formed of at least one of insulating materials, which are formed by a spin-on-glass (SOG) process, silicon oxide, or silicon oxynitride. The formation of the first and second insulating separation patterns STI1 and STI2 may include depositing an insulating separation layer to fill the first and second openings OP1 and OP2 and planarizing the insulating separation layer to expose a top surface of the upper insulating layer TIL.

Figure 8A:
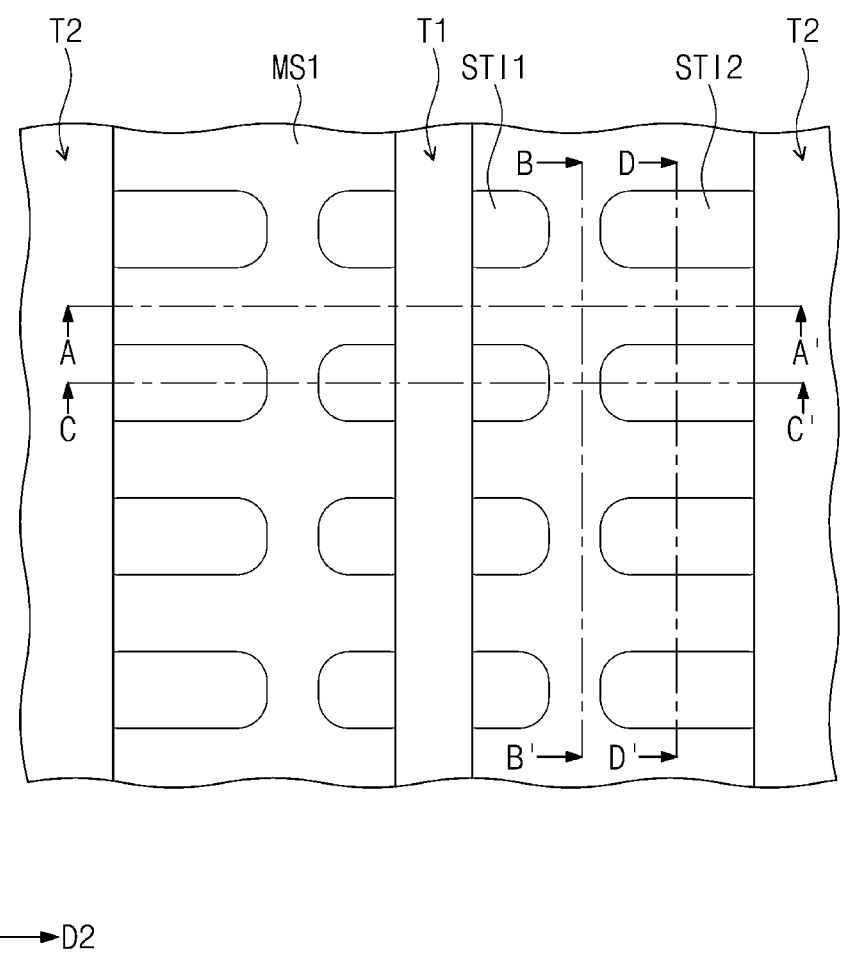
Figure 8B:
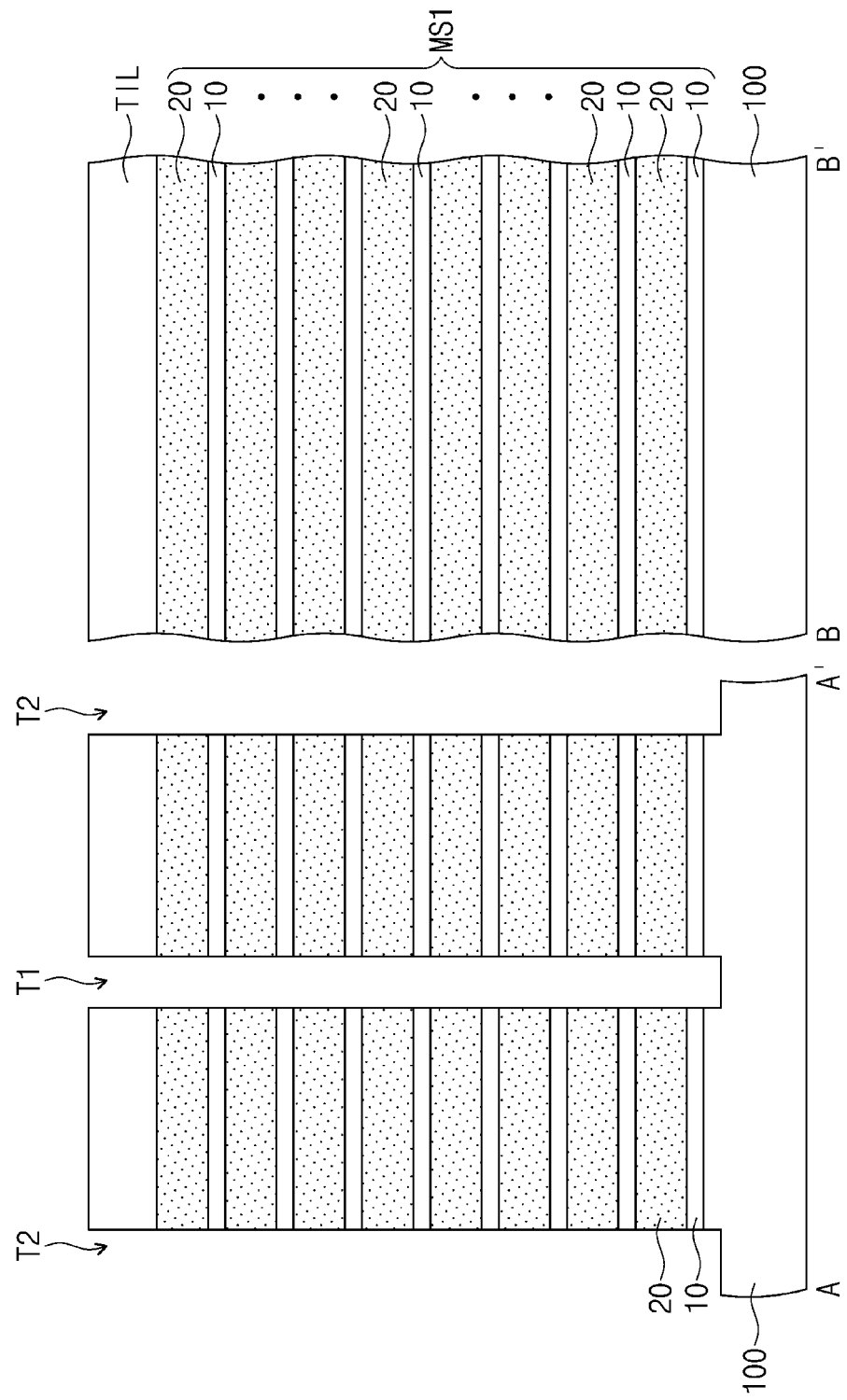

Referring to FIGS. 8A, 8B, and 8C, first and second trenches T1 and T2 may be formed to penetrate the first mold structure MS1 and to expose side surfaces of the first sacrificial layers 10 and the semiconductor layers 20.

In an embodiment, the formation of the first and second trenches T1 and T2 may include forming a mask pattern, which has openings corresponding to the first and second trenches T1 and T2, on the first mold structure MS1 and anisotropically etching the first mold structure MS1 using the mask pattern as an etch mask. The first and second trenches T1 and T2 may be formed to expose the top surface of the semiconductor substrate 100, and in an embodiment in which the anisotropic etching process is performed in an over-etch manner, the top surface of the semiconductor substrate 100 below the first and second trenches T1 and T2 may be vertically recessed to form recess regions.

The first and second trenches T1 and T2 may extend in the first direction D1 to be parallel to each other. In an embodiment, the first and second trenches T1 and T2 may be formed to expose side surfaces of the first sacrificial layers 10 and side surfaces of the semiconductor layers 20. In addition, the first trench T1 may extend in the first direction D1 to expose side surfaces of the first insulating separation patterns STI1.

The second trenches T2 may be formed at both sides of the first trench T1 and may extend in the first direction D1 to expose side surfaces of the second insulating separation patterns STI2.

Figure 9A:
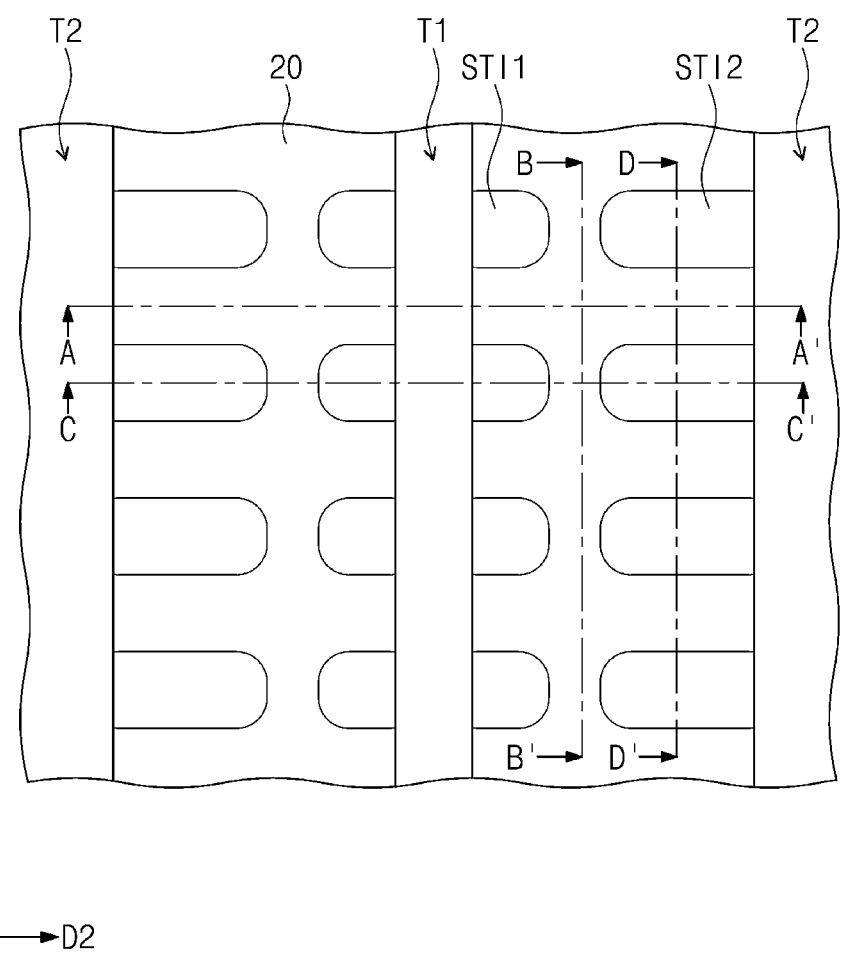
Figure 9B:
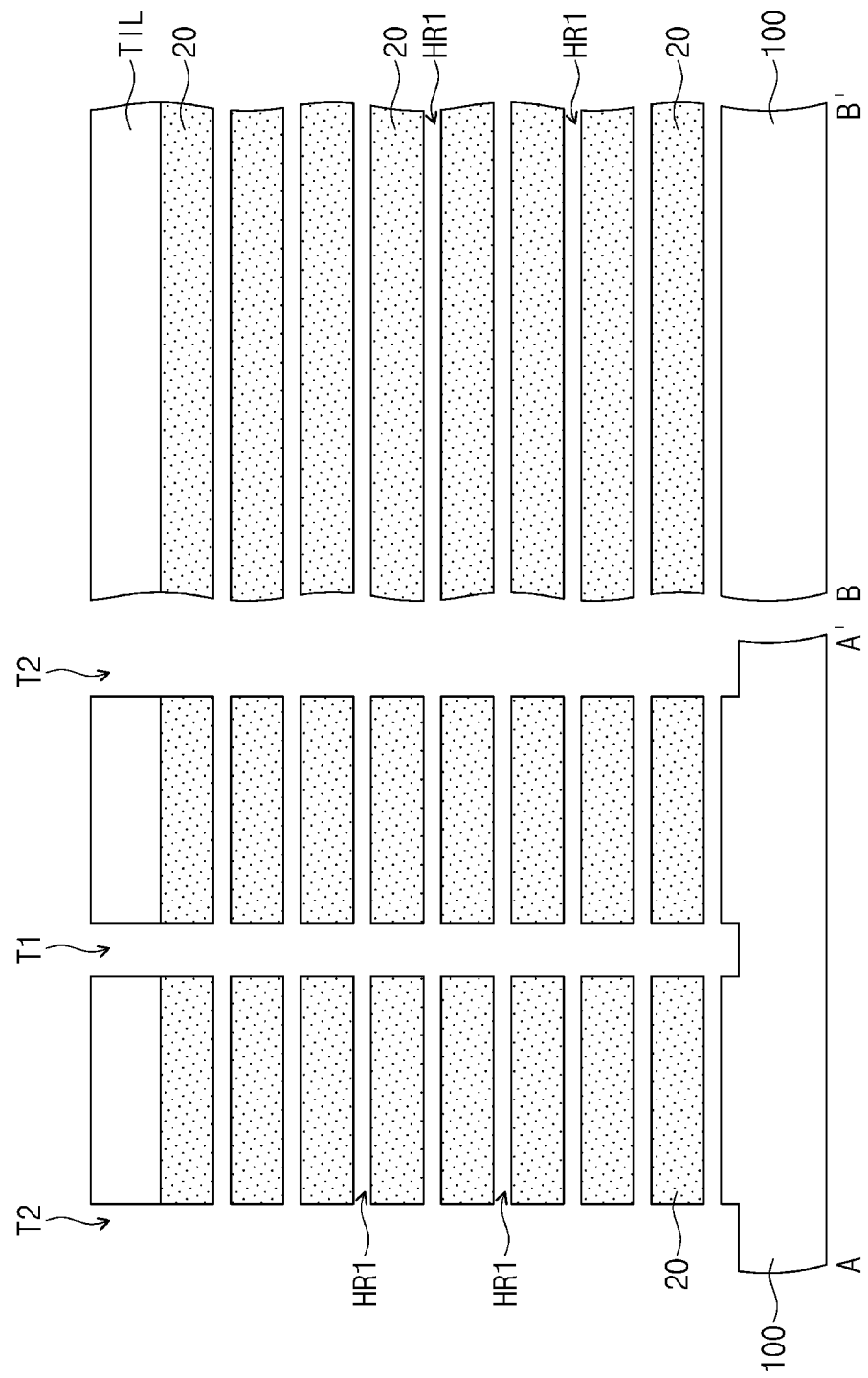

Referring to FIGS. 9A, 9B, and 9C, the first sacrificial layers 10, which are exposed through the first and the second trenches T1 and T2, may be removed to form first horizontal regions HR1 between semiconductor layers 20 that are vertically adjacent to each other (e.g., in the third direction D3).

In an embodiment, the formation of the first horizontal regions HR1 may include isotropically etching the first sacrificial layers 10 using an etching recipe that is chosen to have an etch selectivity with respect to the semiconductor substrate 100, the semiconductor layers 20, and the first and second insulating separation patterns STI1 and STI2. Due to the first and second insulating separation patterns STI1 and STI2, the semiconductor layers 20, which are spaced apart from each other in the third direction D3, may not collapse when the first sacrificial layers 10 are removed.

A thickness of the first horizontal regions HR1 in the third direction D3 (e.g., a distance between adjacent semiconductor layers 20 in the third direction D3) may be substantially equal to the thickness of each of the first sacrificial layers 10.

Figure 10A:
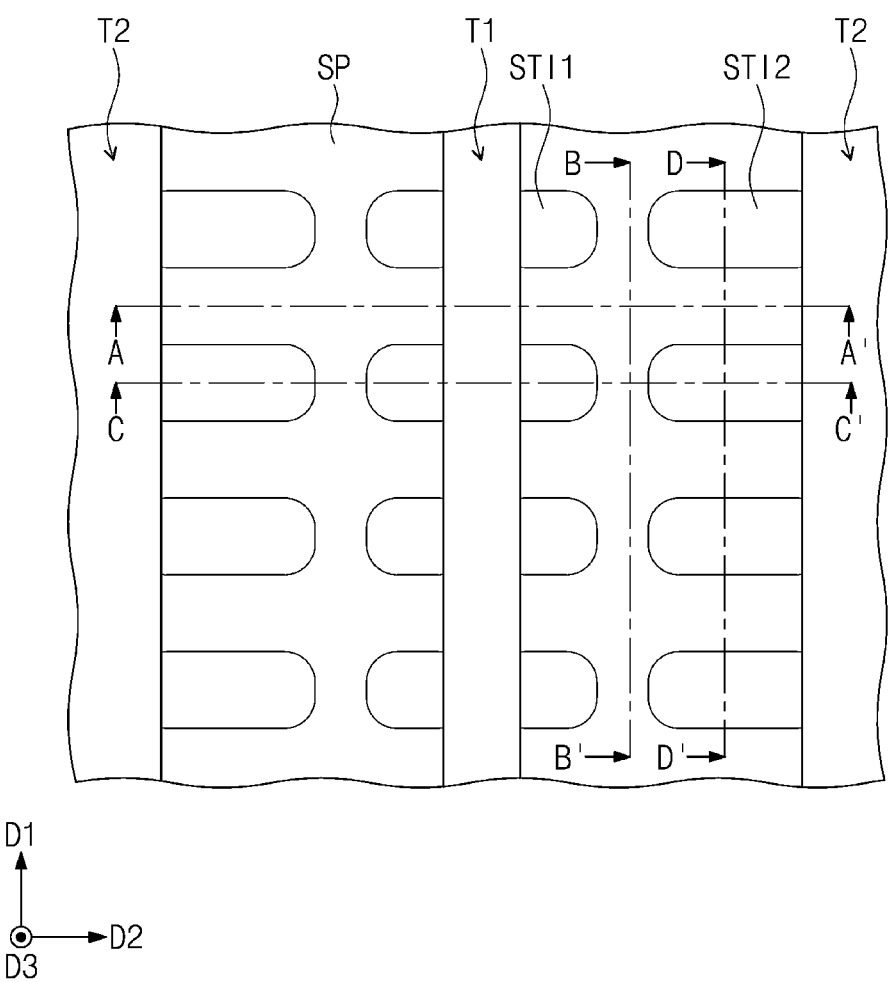
Figure 10C:
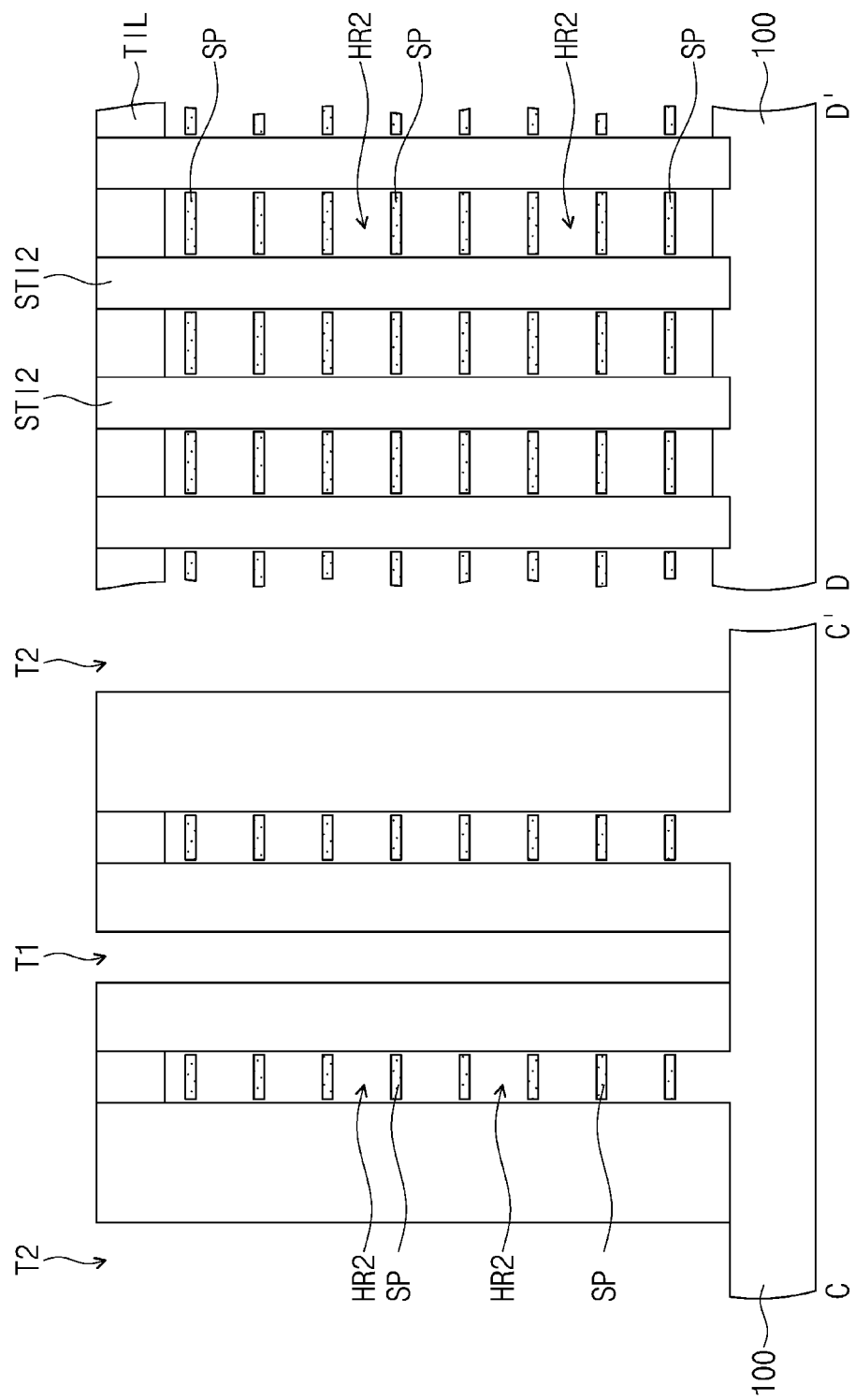

Referring to FIGS. 10A, 10B, and 10C, an enlargement process may be performed to increase the vertical thicknesses of the first horizontal regions HR1. In an embodiment, the enlargement process may include etching top and bottom surfaces of the semiconductor layers 20 that are exposed by the first horizontal regions HR1. The enlargement process may include an isotropic etching process that is performed with an etch selectivity with respect to the upper insulating layer TIL and the first and second insulating separation patterns STI1 and STI2. As a result of the enlargement process, each of the semiconductor layers 20 may have a reduced thickness. Thus, the semiconductor patterns SP may be formed, and second horizontal regions HR2 may be respectively formed between the semiconductor patterns SP, which are adjacent to each other in the third direction D3.

In an embodiment, an oxidation process on the semiconductor patterns SP may be performed to form sacrificial oxide layers on exposed surfaces of the semiconductor patterns SP. Thereafter, the sacrificial oxide layers may be removed to re-expose the surfaces of the semiconductor patterns SP. After the removal of the sacrificial oxide layers, a distance between the semiconductor patterns SP, which are adjacent to each other in the third direction D3, may be increased. For example, the second horizontal regions HR2 may be vertically expanded (e.g., in the third direction D3).

Figure 11A:
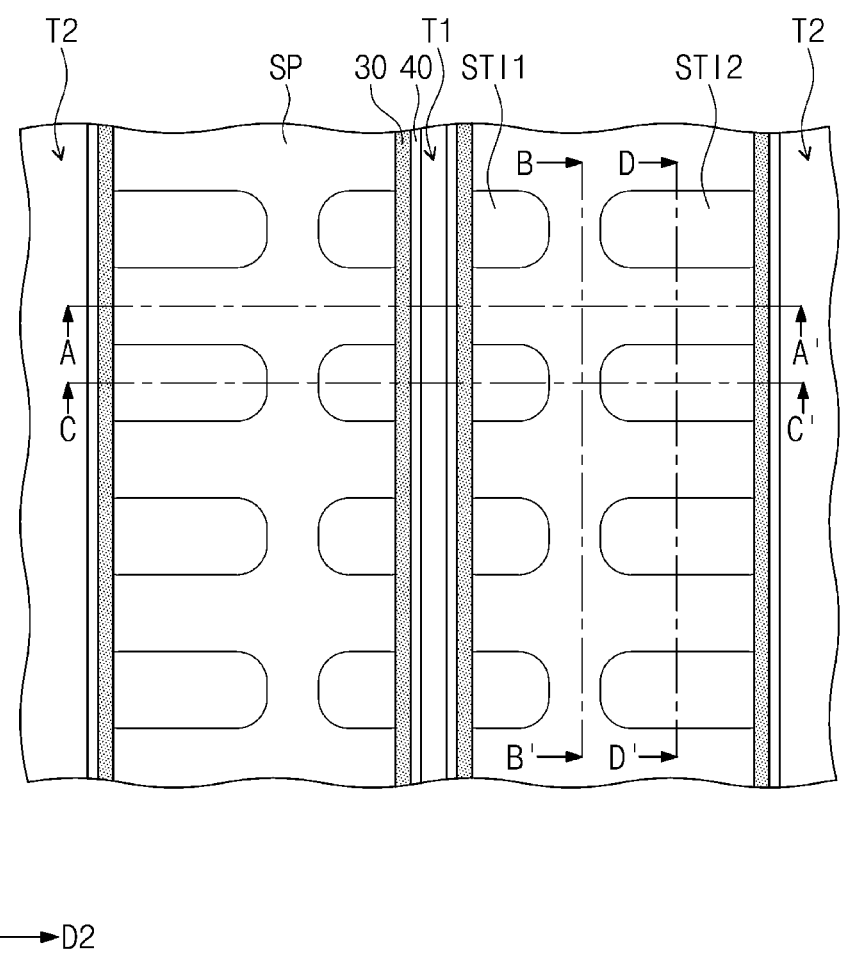
Figure 11C:
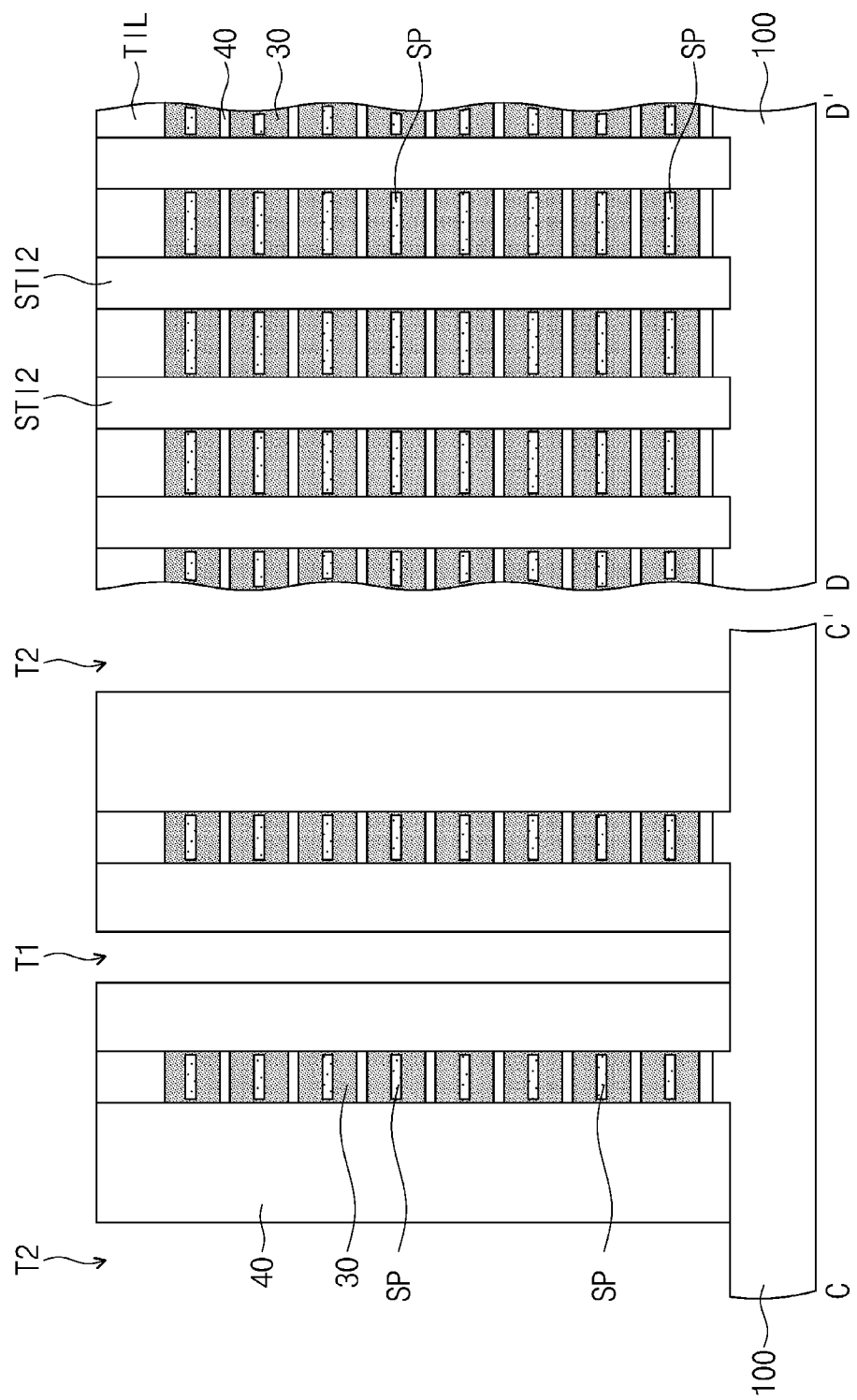

Referring to FIGS. 11A, 11B, and 11C, a second sacrificial layer 30 and an interlayer insulating layer 40 may be sequentially deposited on the surfaces of the semiconductor patterns SP.

In an embodiment, the second sacrificial layer 30 may be formed by depositing a material having an etch selectivity with respect to the semiconductor substrate 100 and the semiconductor patterns SP. For example, in an embodiment, the second sacrificial layer 30 may be formed of at least one compound selected from silicon oxide, silicon nitride, and silicon oxynitride. The second sacrificial layer 30 may be formed by an atomic layer deposition method or a chemical vapor deposition method.

The second sacrificial layer 30 may be deposited to surround each of the semiconductor patterns SP. In an embodiment, the second sacrificial layer 30 may be deposited to have a thickness that is less than half of the thickness of each of the second horizontal regions HR2 in the third direction D3. Accordingly, gap regions may be defined between the semiconductor patterns SP, which are adjacent to each other in the third direction D3, after the deposition of the second sacrificial layer 30.

Thereafter, the interlayer insulating layer 40 may be formed on the second sacrificial layer 30 to fill the second horizontal regions HR2, in which the second sacrificial layer 30 is formed. The interlayer insulating layer 40 may be formed of an insulating material that has an etch selectivity with respect to the second sacrificial layer 30 and the semiconductor substrate 100. For example, in an embodiment, the interlayer insulating layer 40 may be formed of silicon oxide. However, embodiments of the present inventive concept are not necessarily limited thereto.

Figure 12A:
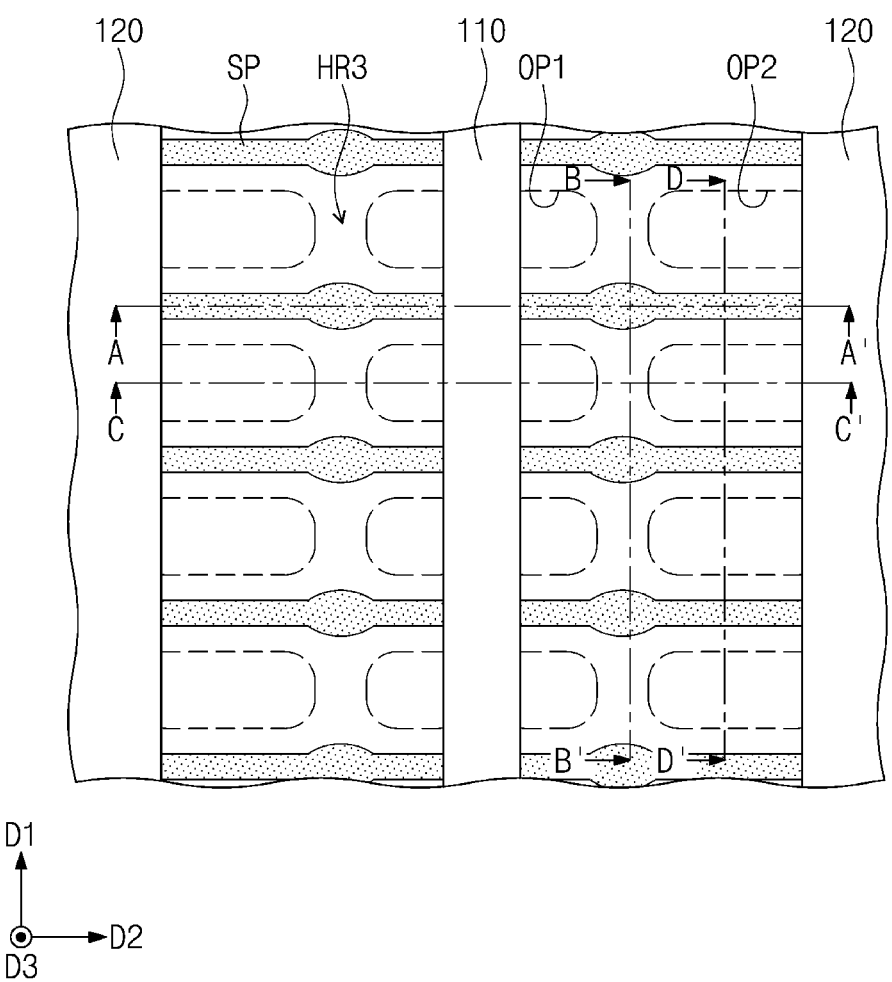
Figure 12B:
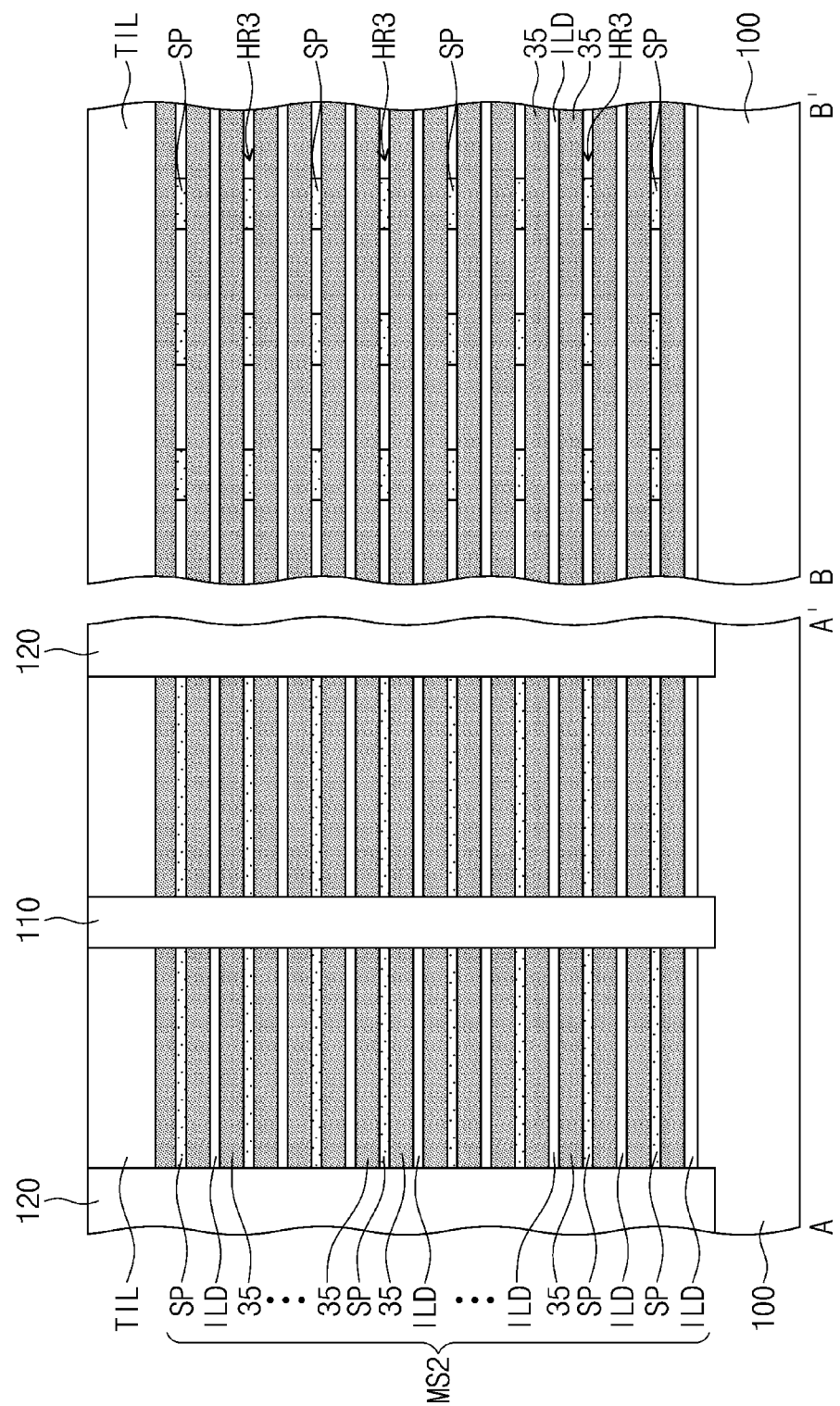
Figure 12C:
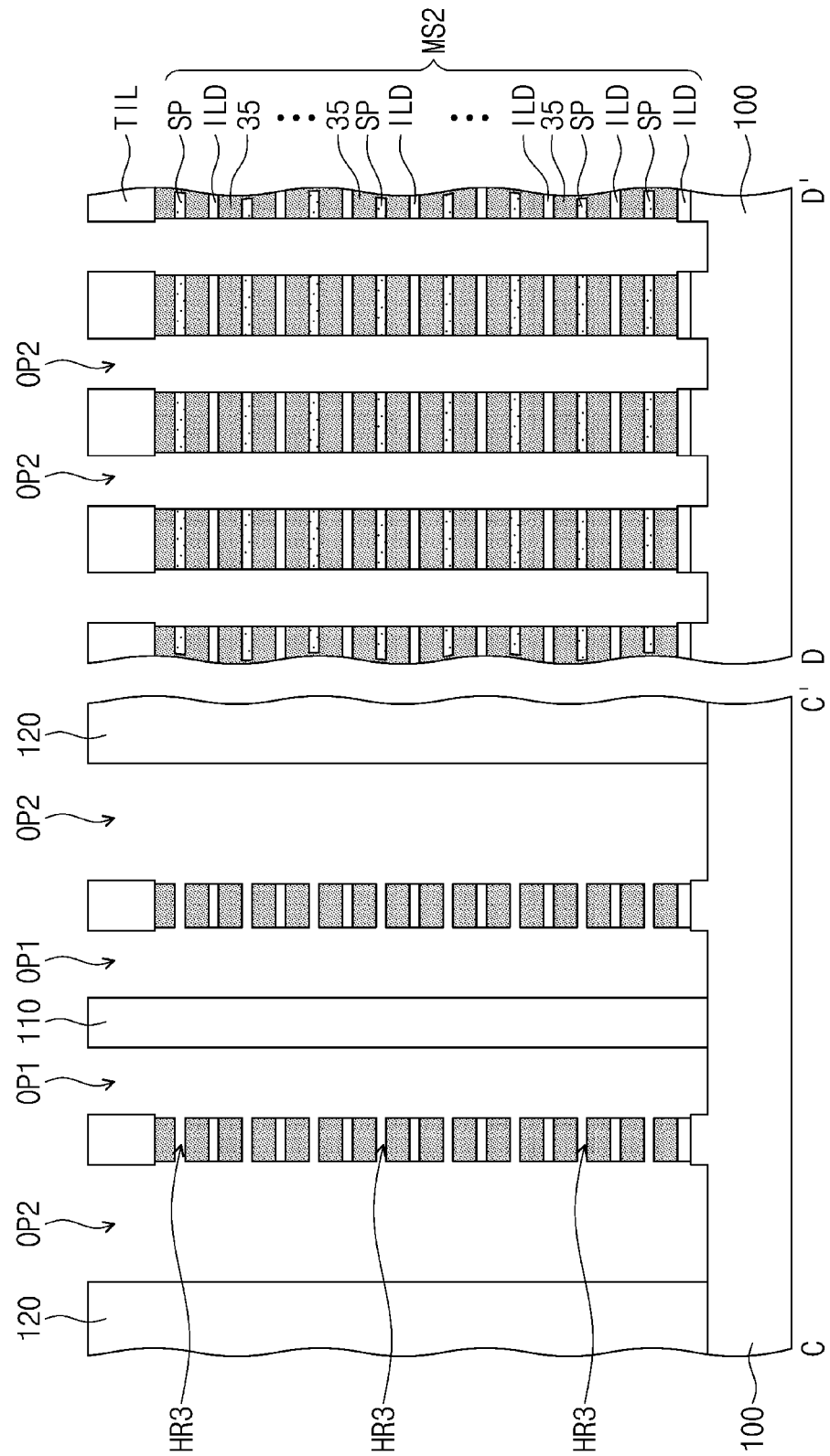

Referring to FIGS. 12A, 12B, and 12C, partial etching processes may be sequentially performed on the interlayer insulating layer 40 and the second sacrificial layer 30 to form a second mold structure MS2.

For example, after the formation of the interlayer insulating layer 40, the interlayer dielectric patterns ILD may be formed by etching portions of the interlayer insulating layer 40, which are exposed through the first and second trenches T1 and T2. In an embodiment, the interlayer dielectric patterns ILD may be formed by isotropically etching the interlayer insulating layer 40 until the second sacrificial layer 30 is exposed through the first and second trenches T1 and T2. As a result of the isotropic etching process, the interlayer dielectric patterns ILD may have rounded side surfaces. Adjacent interlayer dielectric patterns ILD may be spaced apart from each other in the third direction D3.

Next, after the formation of the interlayer dielectric patterns ILD, second sacrificial patterns 35 may be formed by etching portions of the second sacrificial layer 30, which are exposed through the first and second trenches T1 and T2. The second sacrificial patterns 35 may be formed by isotropically etching the second sacrificial layer 30 until the semiconductor patterns SP are exposed. As a result of the isotropic etching process, the second sacrificial patterns 35 may have rounded side surfaces. The second sacrificial patterns 35 may be spaced apart from each other in the third direction D3, and each of the semiconductor patterns SP may be disposed between a corresponding pair of the second sacrificial patterns 35, which are adjacent to each other in the third direction D3.

The second mold structure MS2, which is formed by the afore-described method, may include the interlayer dielectric patterns ILD, the second sacrificial patterns 35, and the semiconductor patterns SP. For example, the second mold structure MS2 may include a plurality of stack structures, and in this embodiment, each of the stack structures may include the semiconductor pattern SP, the second sacrificial pattern 35, the interlayer dielectric pattern ILD, and the second sacrificial pattern 35 which are sequentially stacked (e.g., in the third direction D3).

After the formation of the second mold structure MS2, first and second gapfill insulating patterns 110 and 120 may be formed to fill the first and second trenches T1 and T2. In an embodiment, the formation of the first and second gapfill insulating patterns 110 and 120 may include forming an insulating gapfill layer to fill the first and second trenches T1 and T2 and planarizing the insulating gapfill layer to expose the top surface of the upper insulating layer TIL. The planarization of the insulating gapfill layer may be achieved by a planarization process, such as a chemical-mechanical polishing process or an etch-back process.

The first and second gapfill insulating patterns 110 and 120 may be formed of an insulating material that has an etch selectivity with respect to the first and second insulating separation patterns STI1 and STI2. For example, in an embodiment, the first and second gapfill insulating patterns 110 and 120 may be formed of at least one compound selected from silicon oxide, silicon nitride, and silicon oxynitride. Each of the first and second gapfill insulating patterns 110 and 120 may have a single- or multi-layered structure.

After the formation of the first and second gapfill insulating patterns 110 and 120, the first and second openings OP1 and OP2 may be re-formed by removing the first and second insulating separation patterns STI1 and STI2. Here, the first and second openings OP1 and OP2 may be formed to expose side surfaces of the semiconductor patterns SP, side surfaces of the second sacrificial patterns 35, side surfaces of the interlayer dielectric patterns ILD, and portions of the top surface of the semiconductor substrate 100.

In an embodiment, the removal of the first and second insulating separation patterns STI1 and STI2 may include an etching process that is performed with an etch selectivity with respect to the semiconductor substrate 100, the second sacrificial patterns 35, the semiconductor patterns SP, and the first and second gapfill insulating patterns 110 and 120. For example, in an embodiment in which the first and second insulating separation patterns STI1 and STI2 are formed of or include silicon oxide, a dry etching process, a chemical etching process, or a wet etching process may be performed on the first and second insulating separation patterns STI1 and STI2. In an embodiment, in the wet etching process, a buffered oxide etchant (BOE) or hydrogen fluoride (HF) may be used to etch the first and second insulating separation patterns STI1 and STI2. In the dry etching process, $CF_4$, NH$_3$, CHF$_3$, C$_2$Fe or BF; gas may be used to etch the first and second insulating separation patterns STI1 and STI2. However, embodiments of the present inventive concept are not necessarily limited thereto.

An etching process may be performed on portions of the semiconductor patterns SP, which are exposed through the first and second openings OP1 and OP2. Thus, the semiconductor patterns SP may be spaced apart from each other in the first direction D1.

An isotropic etching process may be performed on the semiconductor patterns SP, which are exposed through the first and second openings OP1 and OP2. For example, the semiconductor patterns SP may be etched laterally (e.g., in the first and second directions D1 and D2) by an etchant, which is supplied through the first and second openings OP1 and OP2. Here, a distance between the first openings OP1 and a distance between the second openings OP2 may be greater than a distance between the first and second openings OP1 and OP2, and thus, it may be possible to form the semiconductor patterns SP, which are spaced apart from each other in the first direction D1. As a result of the isotropic etching process, a width of each of the semiconductor patterns SP in the first direction D1 may be greater at its center portion than at its side portion.

As a result of the afore-described process to form the semiconductor patterns SP, third horizontal regions HR3 may be formed between the second sacrificial patterns 35 to expose side surfaces of the semiconductor patterns SP. The third horizontal regions HR3 may correspond to empty spaces, which are formed by etching the semiconductor patterns SP.

Figure 13A:
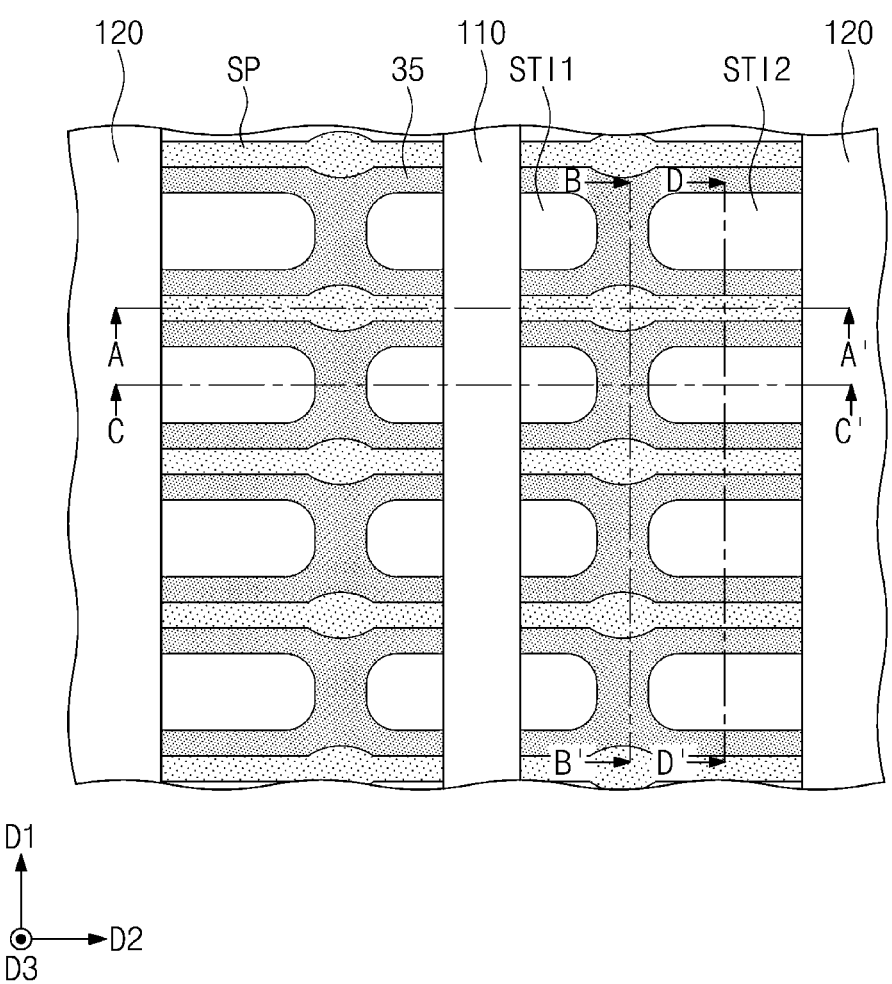
Figure 13B:
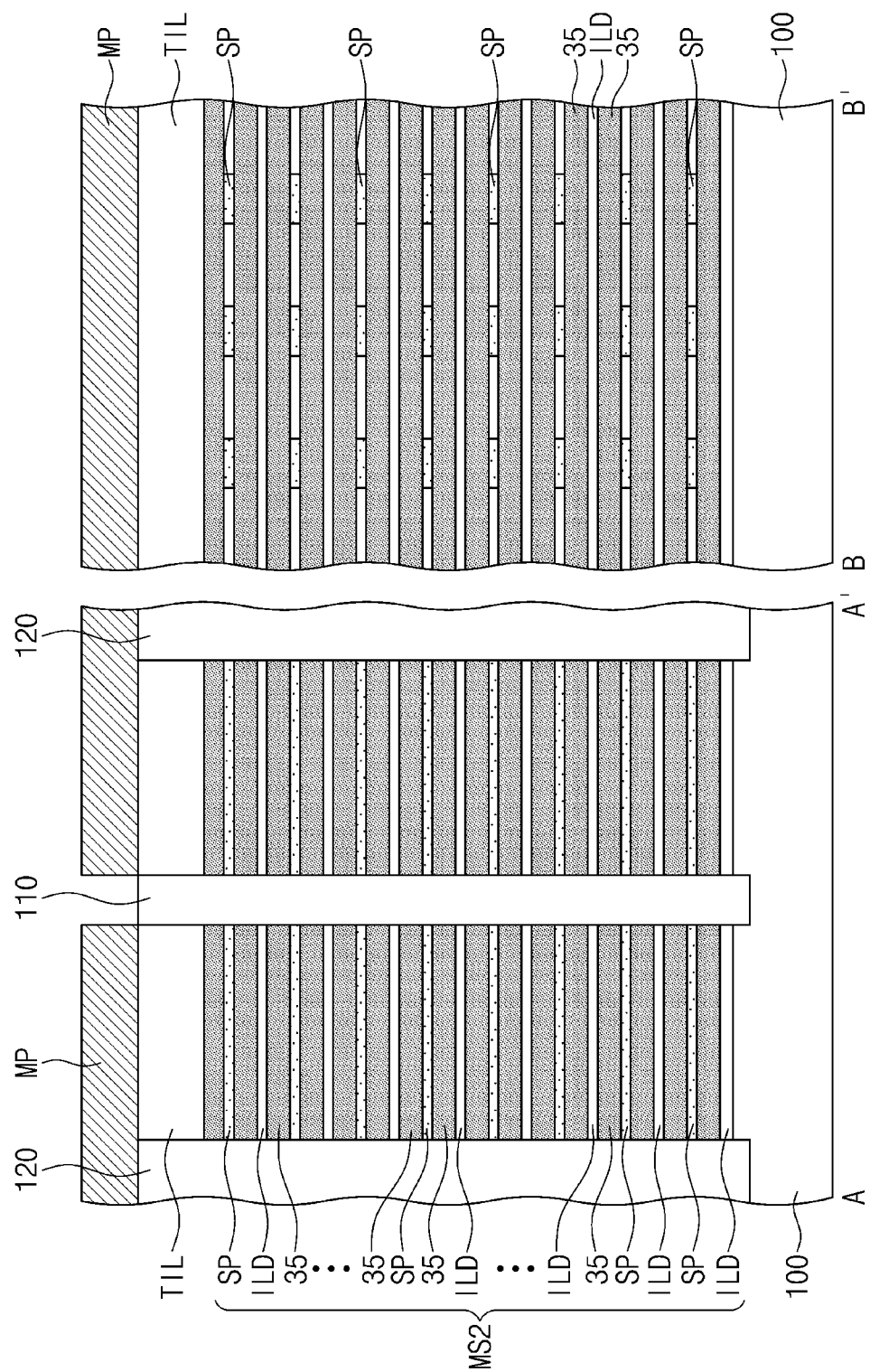
Figure 13C:
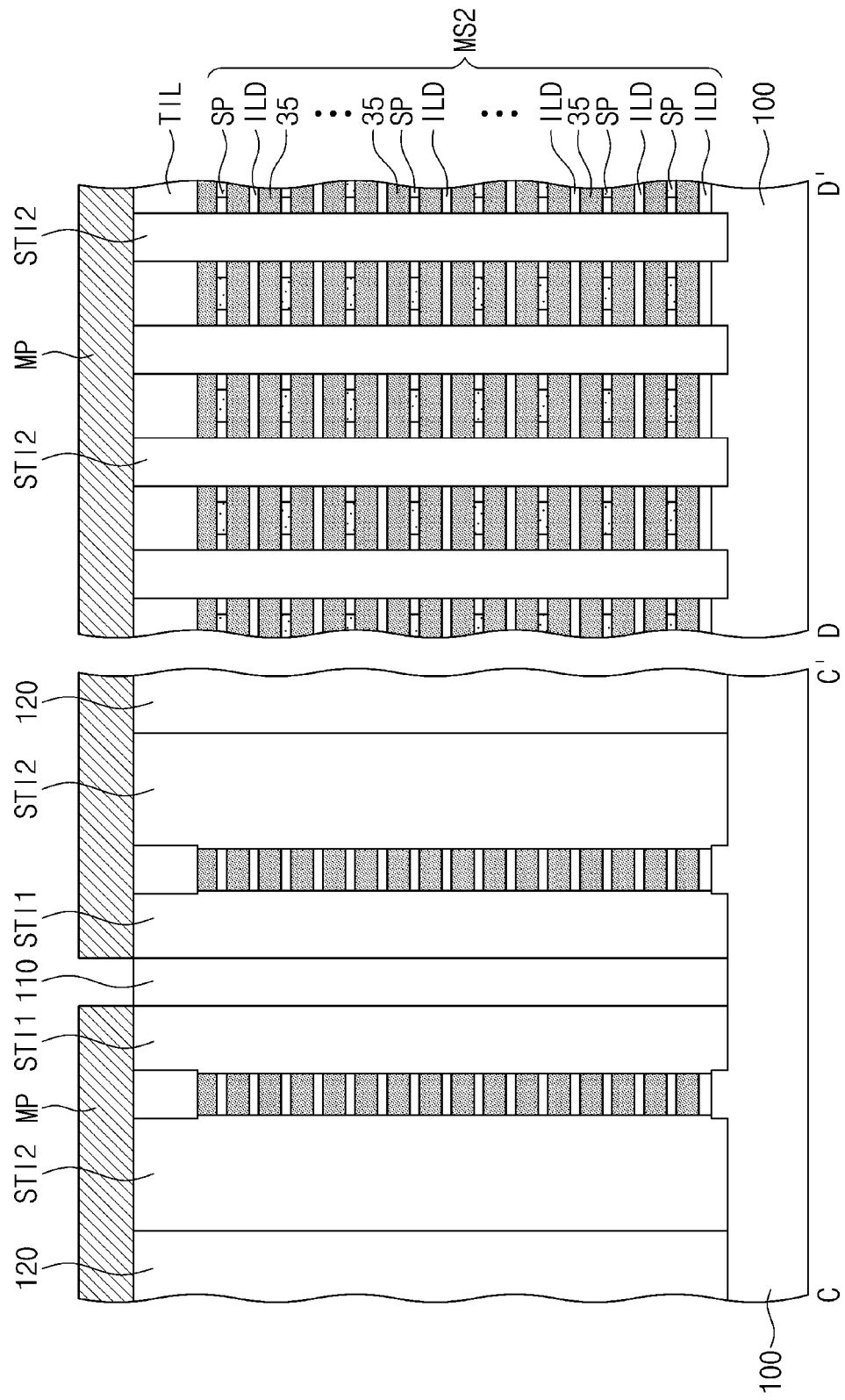

Referring to FIGS. 13A, 13B, and 13C, after the formation of the semiconductor patterns SP, the first and second insulating separation patterns STI1 and STI2 may be re-formed by filling the first and second openings OP1 and OP2 with an insulating material.

In an embodiment, the first and second insulating separation patterns STI1 and STI2 may be formed of an insulating material that has an etch selectivity with respect to the second sacrificial patterns 35 and the interlayer dielectric patterns ILD. For example, the first and second insulating separation patterns STI1 and STI2 may be formed of at least one compound selected from silicon oxide, silicon oxynitride, and silicon nitride. However, embodiments of the present inventive concept are not necessarily limited thereto. Each of the first and second insulating separation patterns STI1 and STI2 may have a single- or multi-layered structure.

In an embodiment, the formation of the first and second insulating separation patterns STI1 and STI2 may include forming an insulating layer to fill the first and second openings OP1 and OP2 and planarizing the insulating layer to expose the top surface of the upper insulating layer TIL. The planarization of the insulating layer may be achieved by a planarization process, such as a chemical-mechanical polishing process or an etch-back process. The insulating layer filling the first and second openings OP1 and OP2 may be formed by an atomic layer deposition (ALD) process, a chemical vapor deposition (CVD) process, or a spin-on-glass (SOG) process.

During the formation of the first and second insulating separation patterns STI1 and STI2, the third horizontal regions HR3 may be filled with an insulating material and may be left as an empty space.

After the re-formation of the first and second insulating separation patterns STI1 and STI2, a mask pattern MP may be formed on the upper insulating layer TIL to expose the first gapfill insulating patterns 110.

Figure 14A:
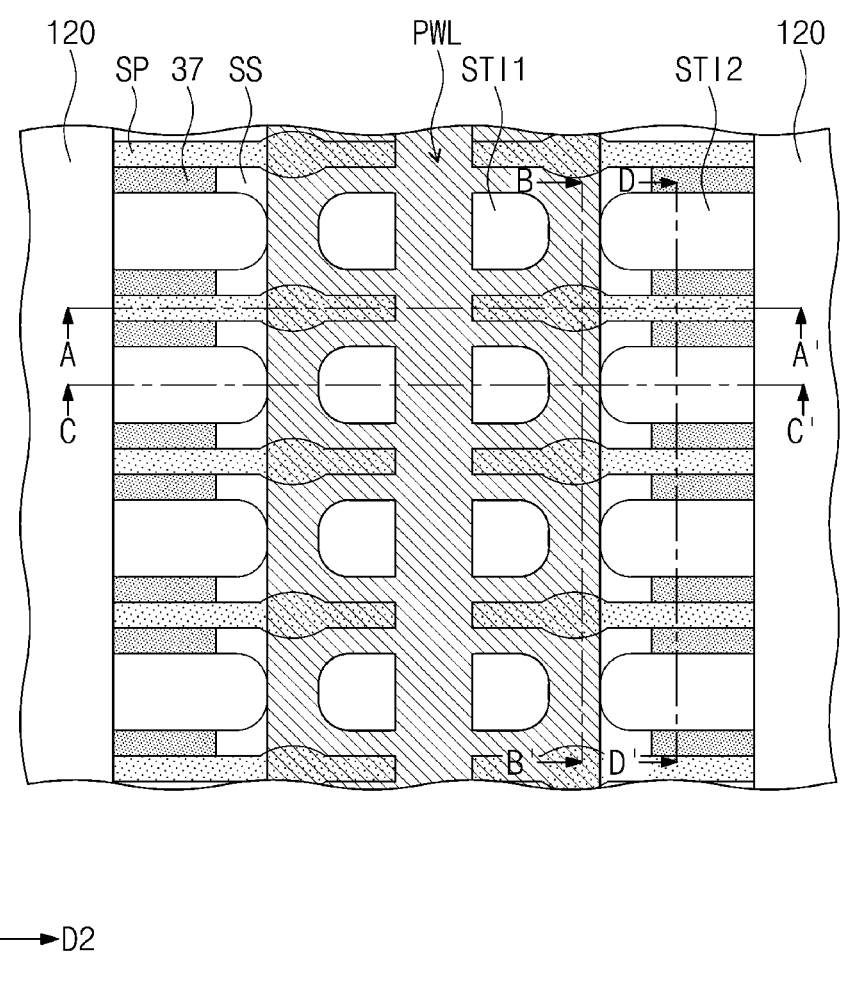
Figure 14B:
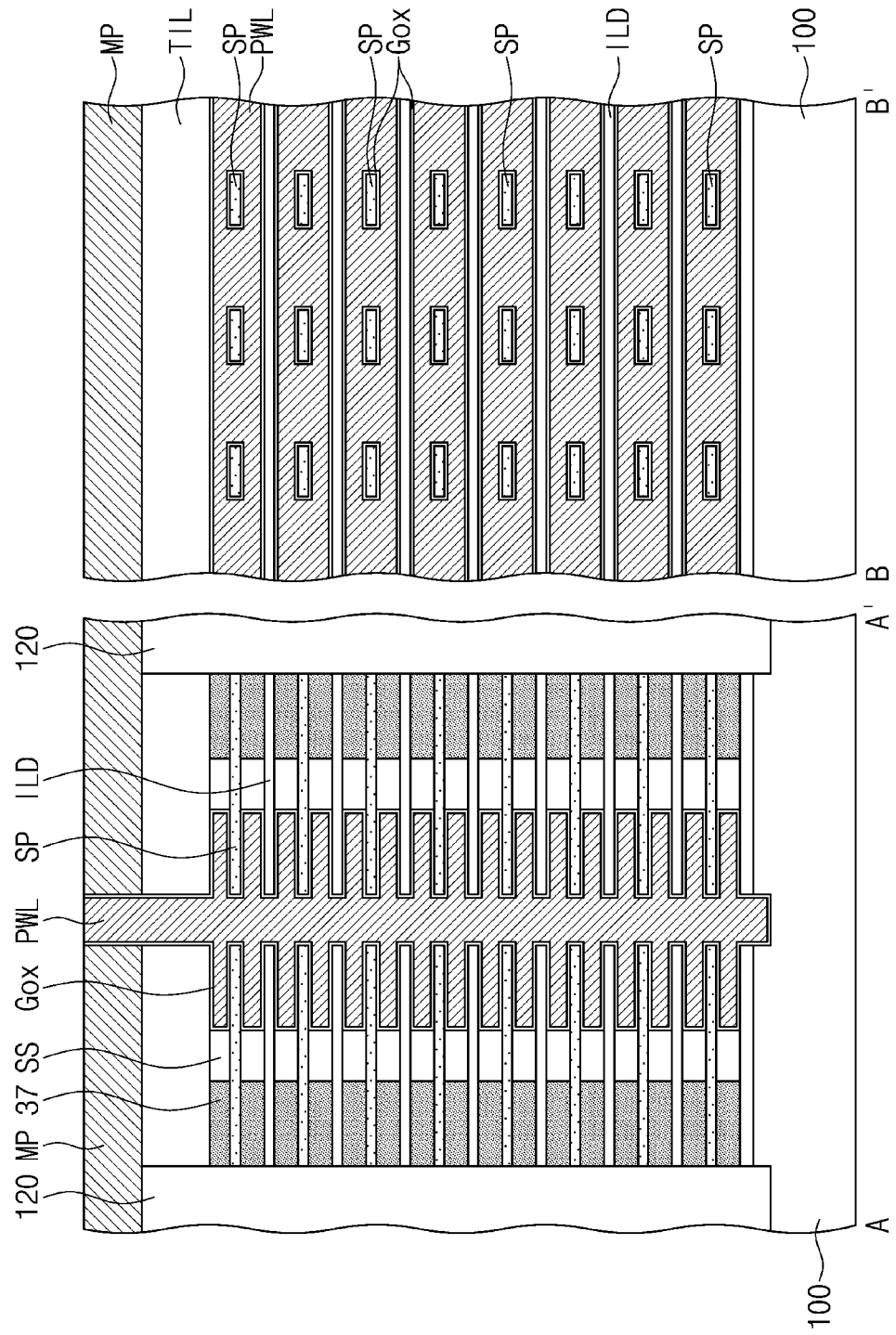
Figure 14C:
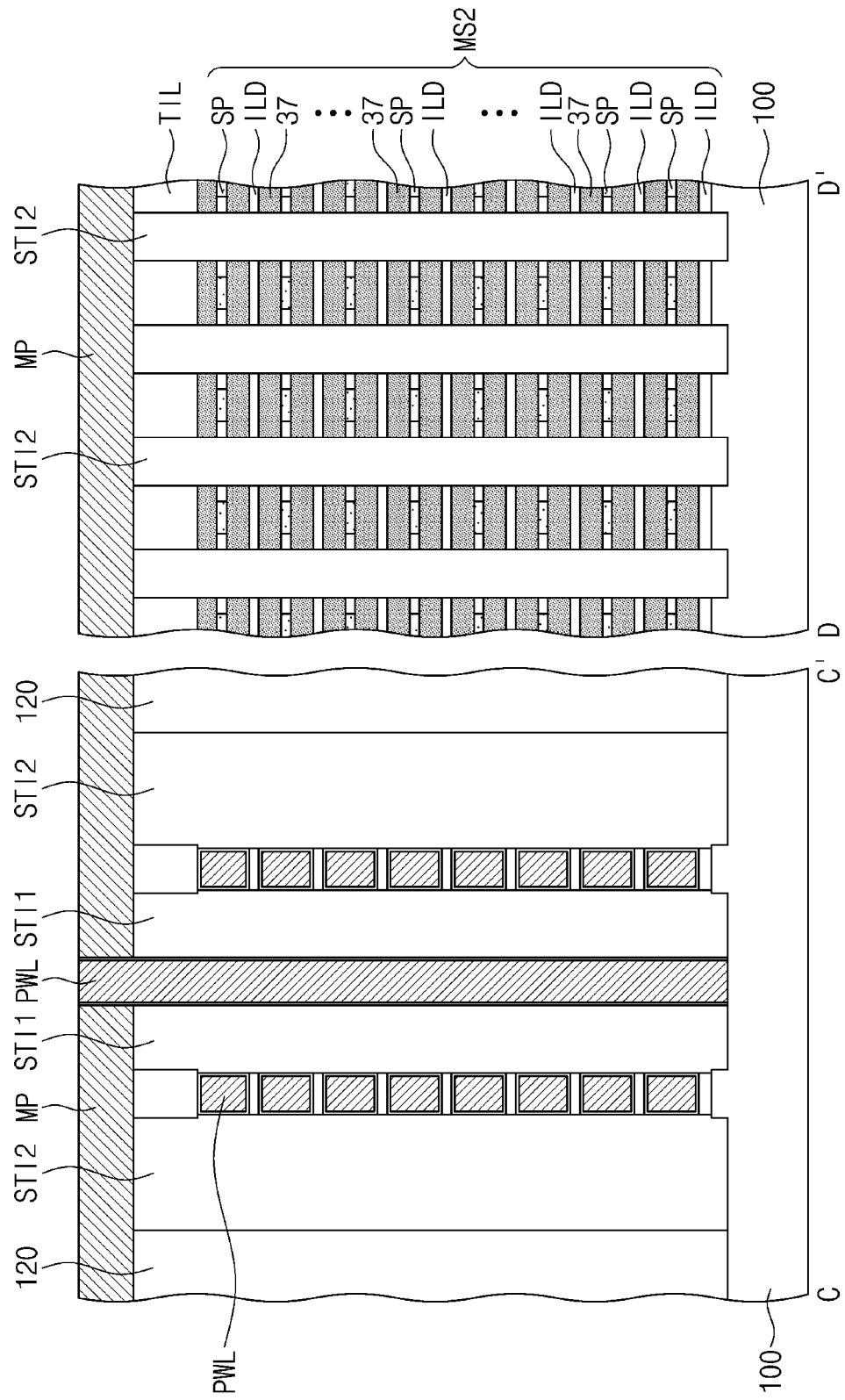

Referring to FIGS. 14A, 14B, and 14C, the first trench T1 exposing the semiconductor substrate 100 may be re-formed by etching the first gapfill insulating patterns 110 using the mask pattern MP as an etch mask. Here, the first trench T1 may expose the side surfaces of the semiconductor patterns SP, the side surfaces of the second sacrificial patterns 35, and the side surfaces of the interlayer dielectric patterns ILD.

Next, portions of the second sacrificial patterns 35 exposed through the first trench T1 may be removed to respectively form fourth horizontal regions between the semiconductor patterns SP and the interlayer dielectric patterns ILD.

In an embodiment, the fourth horizontal regions may be formed by isotropically etching the second sacrificial patterns 35 using an etch recipe that is chosen to have an etch selectivity with respect to the semiconductor patterns SP and the interlayer dielectric patterns ILD. For example, in an embodiment in which the second sacrificial patterns 35 are formed of silicon nitride and the interlayer dielectric patterns ILD are formed of silicon oxide, the fourth horizontal regions may be formed by isotropically etching the second sacrificial patterns 35 using etching solution containing phosphoric acid. The fourth horizontal regions may extend in the first direction D1, between the first and second insulating separation patterns STI1 and STI2.

As a result of the formation of the fourth horizontal regions, the second sacrificial patterns 35 may be partially left to form third sacrificial patterns 37. The third sacrificial patterns 37 may be spaced apart from each other in the first direction D1 by the second insulating separation patterns STI2.

The spacer insulating patterns SS may be formed to fill portions of the fourth horizontal regions. The formation of the spacer insulating patterns SS may include depositing an insulating layer to fill the fourth horizontal regions and partially etching the insulating layer to leave portions of the insulating layer. The spacer insulating patterns SS may be spaced apart from each other in the first direction D1 by the second insulating separation patterns STI2.

A preliminary word line PWL may be formed to fully fill the fourth horizontal regions and the first trench T1. Before the formation of the preliminary word line PWL, the gate insulating layer Gox may be formed to conformally cover inner surfaces of the fourth horizontal regions and the first trench T1. The preliminary word line PWL may be formed to fill a space enclosed by the gate insulating layer Gox and to surround a portion of each of the semiconductor patterns SP.

In an embodiment, the preliminary word line PWL may include first portions, which extend in the second direction D2 to fill the fourth horizontal regions, and a pillar-shaped second portion, which extends in the third direction D3 to fill the first trench T1.

Figure 15A:
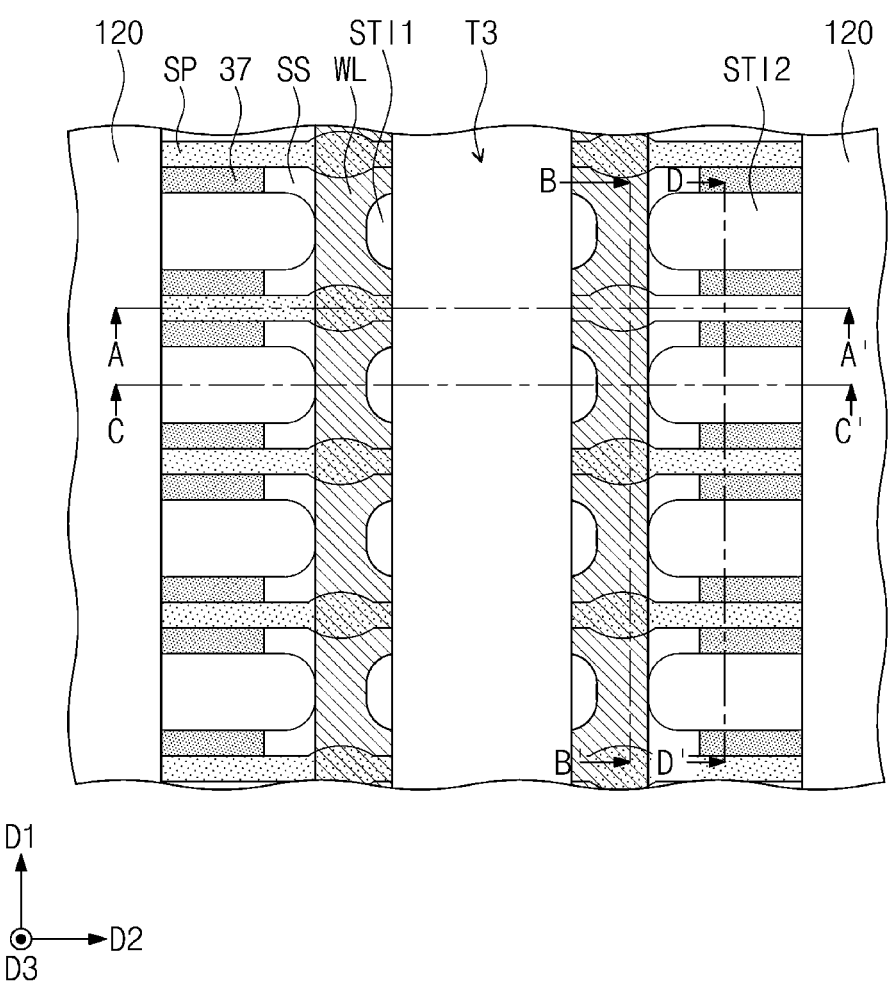
Figure 15B:
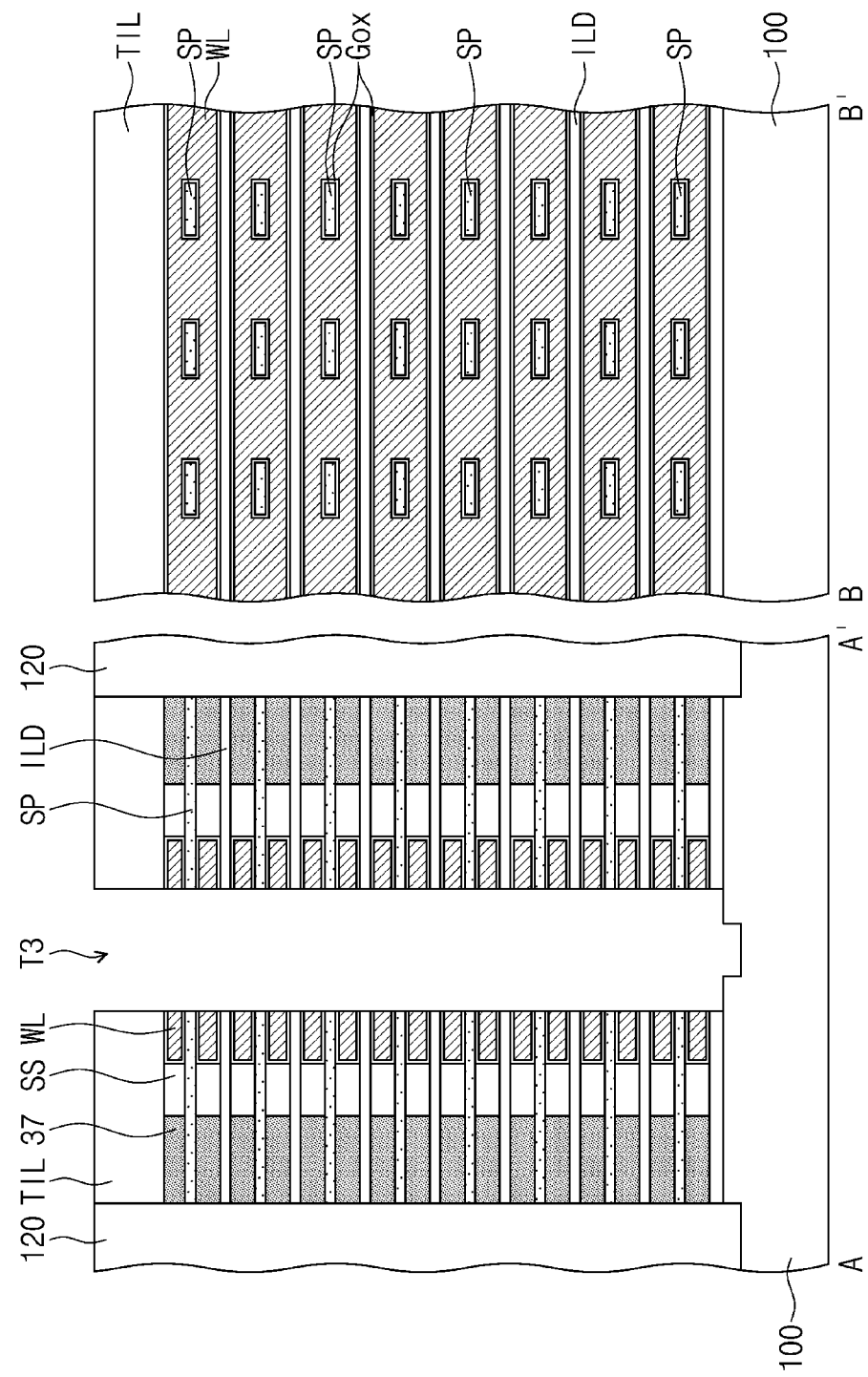
Figure 15C:
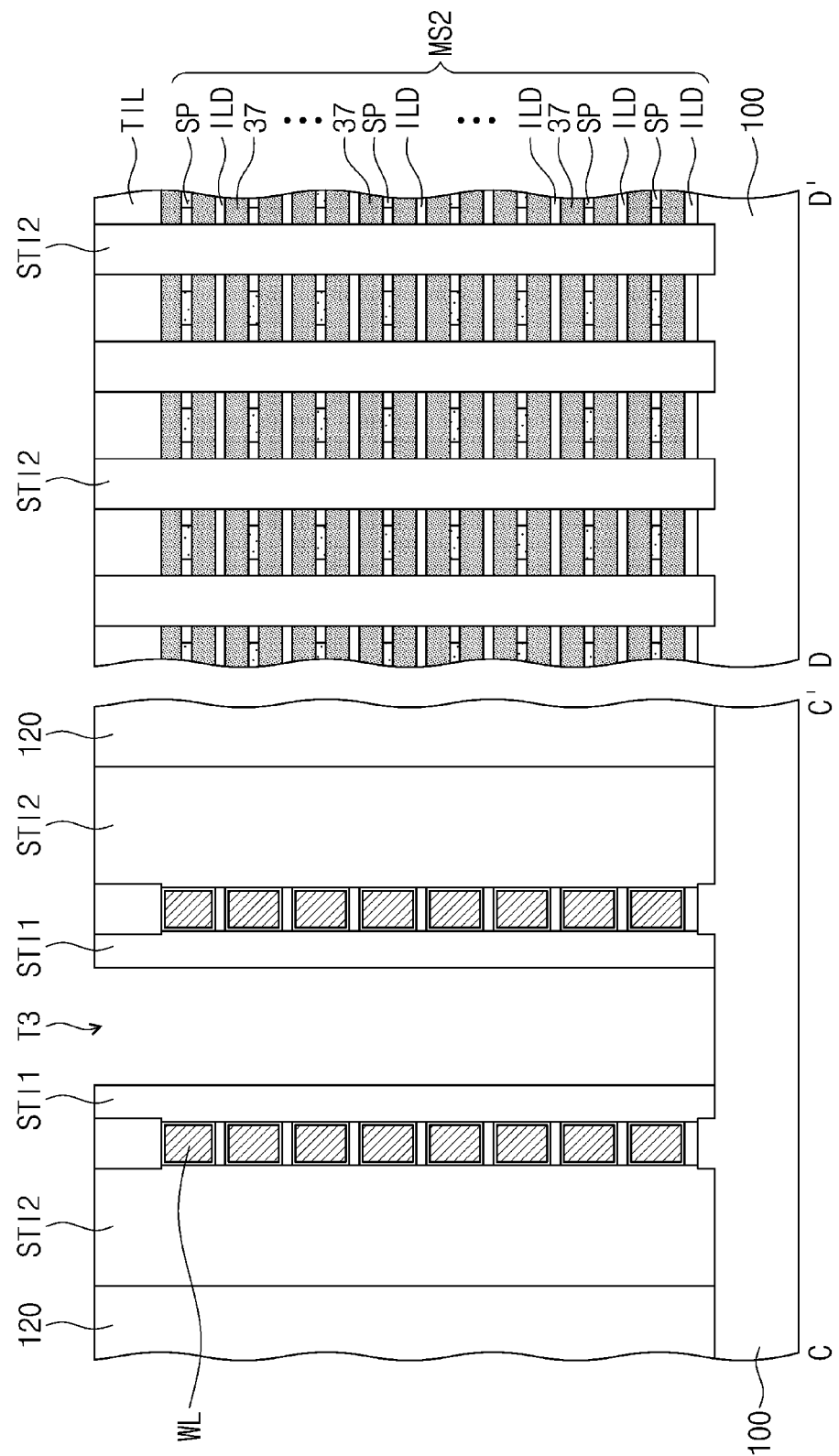

Referring to FIGS. 15A, 15B, and 15C, a third trench T3 may be formed to penetrate a portion of the preliminary word line PWL, a portion of each of the semiconductor patterns SP, and a portion of each of the interlayer dielectric patterns ILD and to extend in the first direction D1. A width of the third trench T3 in the second direction D2 may be greater than a width of the first trench T1 in the second direction D2. The third trench T3 may be formed to expose the top surface of the semiconductor substrate 100, and in an embodiment in which the anisotropic etching process is performed in an over-etch manner, the top surface of the semiconductor substrate 100 below the third trench T3 may be vertically recessed.

The formation of the third trench T3 may be performed to remove the second portion of the preliminary word line PWL, and as a result, the word lines WL may be formed. Each of the word lines WL may be a portion of each of the first portions of the preliminary word line PWL. The third trench T3 may be formed to expose side surfaces of the word lines WL, side surfaces of the semiconductor patterns SP, side surfaces of the interlayer dielectric patterns ILD, and side surfaces of the first insulating separation patterns STI1.

In an embodiment, the formation of the third trench T3 may be performed by a dry etching process. In this embodiment, it may be possible to reduce a variation of the length of the word lines WL in the first direction D1 and thereby to increase reliability and electrical characteristics of the semiconductor memory device.

Referring to FIG. 16, epitaxial patterns EGP may be formed by an epitaxial growth process using each of the semiconductor patterns SP as a seed layer. Each of the epitaxial patterns EGP may protrude laterally (e.g., in the second direction D2) from an inner side surface of the third trench T3. As an example, the largest width of each of the epitaxial patterns EGP in the third direction D3 may be greater than a width of each of the word lines WL in the third direction D3. In addition, a length of each of the epitaxial patterns EGP in the second direction D2 may be in a range of about 10 nm to about 30 nm.

Thereafter, the epitaxial patterns EGP may be doped with impurities. In an embodiment, the impurity doping process may be performed using a source gas containing at least one compound selected from boron (B), carbon (C), and fluorine (F). For example, the epitaxial patterns EGP may contain at least one compound selected from boron (B), carbon (C), and fluorine (F) which are provided as impurities.

Next, a silicide pattern may be formed to conformally cover each of the epitaxial patterns EGP.

Referring to FIG. 17, the lower protection pattern PS may be formed on the top surface of the semiconductor substrate 100, and the capping insulating pattern CP may be formed between the epitaxial patterns EGP to extend in the third direction D3. In an embodiment, the formation of the lower protection pattern PS and the capping insulating pattern CP may include forming a capping insulating layer to fill the third trench T3 and removing a portion of the capping insulating layer.

The capping insulating pattern CP may be formed to cover top and/or bottom surfaces of each of the epitaxial patterns EGP, side surfaces of the word lines WL, and side surfaces of the interlayer dielectric patterns ILD. Due to the capping insulating pattern CP, each of the epitaxial patterns EGP may be electrically separated from the word lines WL adjacent thereto.

Thereafter, the bit lines BL may be formed in the third trench T3 to cover side surfaces of the capping insulating patterns CP. In an embodiment, the formation of the bit lines BL may include forming a conductive layer to fill an inner space of the third trench T3 and removing a portion of the conductive layer to expose at least a portion of a top surface of the lower protection pattern PS.

In an embodiment, the bit lines BL may be formed of at least one material selected from doped silicon, metallic materials, metal nitride materials, and metal silicide materials. For example, the bit lines BL may be formed of tantalum nitride or tungsten.

The bit lines BL may be spaced apart from each other in the first and second directions D1 and D2. Each of the bit lines BL may directly contact the epitaxial patterns EGP. The bit lines BL may extend from the top surface of the lower protection pattern PS in the third direction D3.

Referring back to FIGS. 3A, 3B, and 3C, a third gapfill insulating pattern 130 may be formed to fill the inner space of the third trench T3 provided with the bit lines BL. The third gapfill insulating pattern 130 may extend along the top surface of the lower protection pattern PS in the first direction D1. The third gapfill insulating pattern 130 may extend from the top surface of the lower protection pattern PS in the third direction D3. The third gapfill insulating pattern 130 may be formed to cover side surfaces of the bit lines BL and side surfaces of the first insulating separation patterns STI1. In an embodiment, the third gapfill insulating pattern 130 may be formed of at least one of insulating materials, which are formed by a spin-on-glass (SOG) process, silicon oxide, or silicon oxynitride.

Next, the second trenches T2 may be re-formed by removing the second gapfill insulating pattern 120. Here, the second trenches T2 may be formed to expose side surfaces of the third sacrificial patterns 37, side surfaces of the semiconductor patterns SP, and side surfaces of the interlayer dielectric patterns ILD.

Thereafter, the third sacrificial patterns 37, which are exposed through the second trenches T2, may be removed to form fifth horizontal regions exposing the spacer insulating patterns SS.

In an embodiment, the formation of the fifth horizontal regions may include isotropically etching the third sacrificial patterns 37 using an etching recipe that is chosen to have an etch selectivity with respect to the semiconductor substrate 100, the semiconductor patterns SP, and the interlayer dielectric patterns ILD. During the isotropic etching on the third sacrificial patterns 37, the spacer insulating patterns SS may be used as an etch stop layer.

The fifth horizontal regions may be respectively formed between the interlayer dielectric patterns ILD and the semiconductor patterns SP in the third direction D3 and between the second insulating separation patterns STI2 in the first direction D1.

Thereafter, the storage electrodes SE may be locally formed in the fifth horizontal regions. In an embodiment, the formation of the storage electrodes SE may include depositing a conductive layer to conformally cover inner surfaces of the fifth horizontal regions and inner surfaces of the second trenches T2 and partially removing the conductive layer, which is deposited on the inner surfaces of the second trenches T2, to locally leave conductive patterns in the fifth horizontal regions.

The storage electrodes SE may be spaced apart from each other in the first, second, and third directions D1, D2, and D3. The storage electrodes SE may directly contact the semiconductor patterns SP, which are exposed through the fifth horizontal regions. Each of the storage electrodes SE may be formed to define an empty space in a corresponding one of the fifth horizontal regions. For example, each of the storage electrodes SE may have a hollow cylinder shape having a long axis that is parallel to the second direction D2. In an embodiment, each of the storage electrodes SE may have a pillar shape having a long axis that is parallel to the second direction D2. In an embodiment, the storage electrode SE may be formed of or include at least one material selected from metallic materials, metal nitride materials, and metal silicide materials.

Before the formation of the storage electrodes SE, the second source/drain regions SD2 may be formed by doping portions of the semiconductor patterns SP with impurities, and in this embodiment, the storage electrodes SE may directly contact the second source/drain regions SD2.

Next, the capacitor dielectric layer CIL may be formed to conformally cover the fifth horizontal regions provided with the storage electrodes SE, and then, the plate electrode PE may be formed to fill the fifth horizontal regions and the second trenches T2, in which the storage electrodes SE and/or the capacitor dielectric layer CIL are provided.

Figure 18:
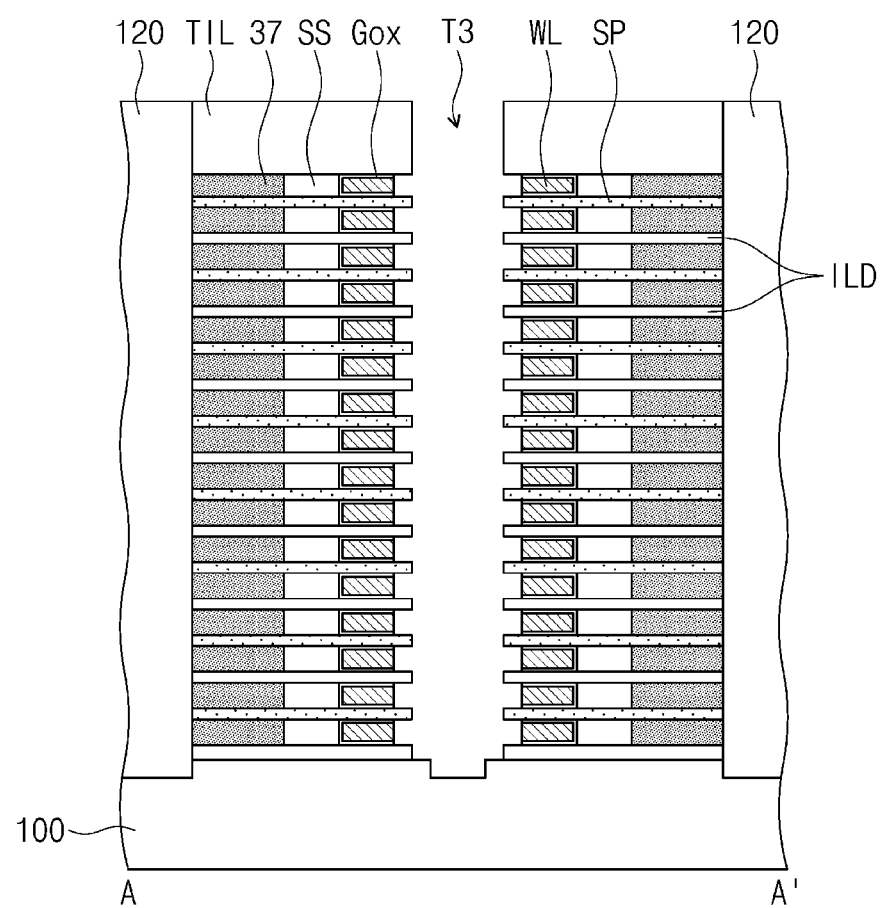
FIGS. 18 and 19 are cross-sectional views illustrating a method of fabricating a semiconductor memory device according to embodiments of the present inventive concept and in particular illustrating a cross-section taken along the line A-A' of FIG. 15A.
Figure 19:
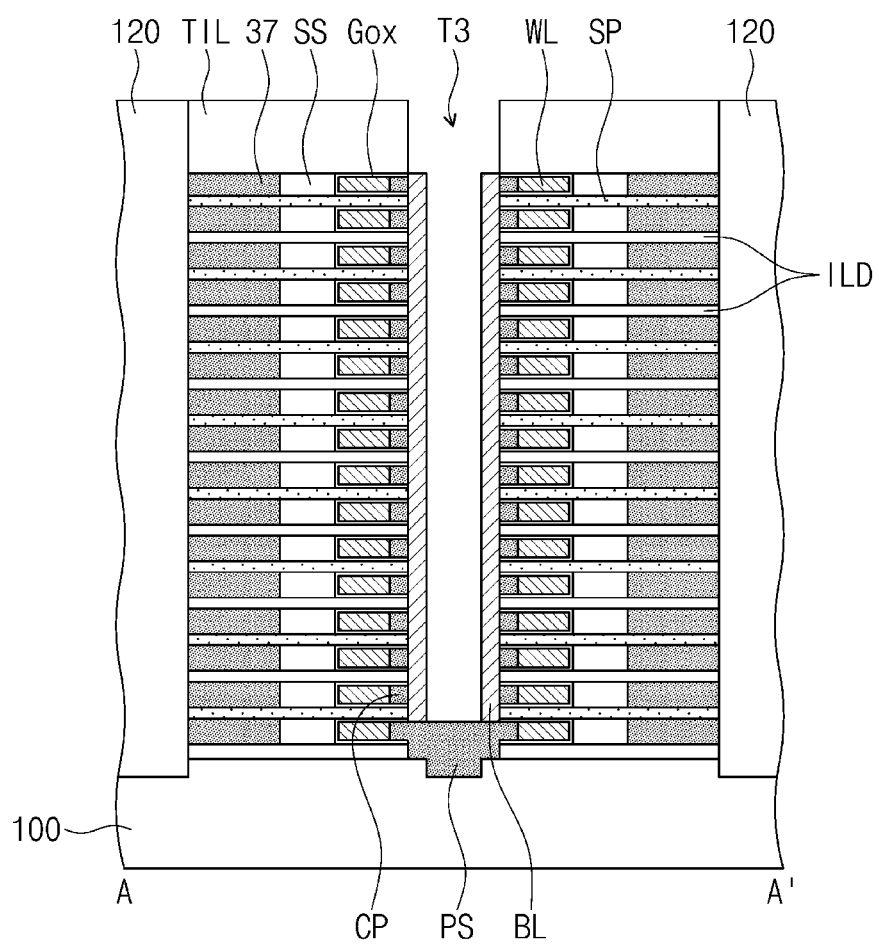

FIGS. 18 and 19 are cross-sectional views illustrating a method of fabricating a semiconductor memory device according to an embodiment of the present inventive concept and in particular illustrating a cross-section taken along the line A-A' of FIG. 15A. Hereinafter, the fabrication method according to this embodiment will be described in more detail with reference to FIGS. 18 and 19. The steps described with reference to FIGS. 7A to 15C are the same in the fabrication method according to this embodiment, and thus, steps performed after the steps of FIGS. 15A to 15C will be described in more detail below.

Referring to FIGS. 18 and 19, each of the word lines WL may be partially recessed in a lateral direction. In an embodiment, the partial recessing of the word lines WL may be achieved by a wet etching process. For example, in an embodiment, a depth of the word lines WL, which are recessed in the second direction D2, may be in a range of about 10 nm to about 30 nm.

The lower protection pattern PS may be formed on the top surface of the semiconductor substrate 100. The capping insulating patterns CP may be formed to fill empty spaces which are formed by the partial recessing of the word lines WL. In an embodiment, the formation of the lower protection pattern PS and the capping insulating patterns CP may include forming a capping insulating layer to fill the third trench T3 and removing a portion of the capping insulating layer.

Thereafter, the bit lines BL may be formed in the third trench T3 to cover side surfaces of the capping insulating patterns CP.

Figure 20A:
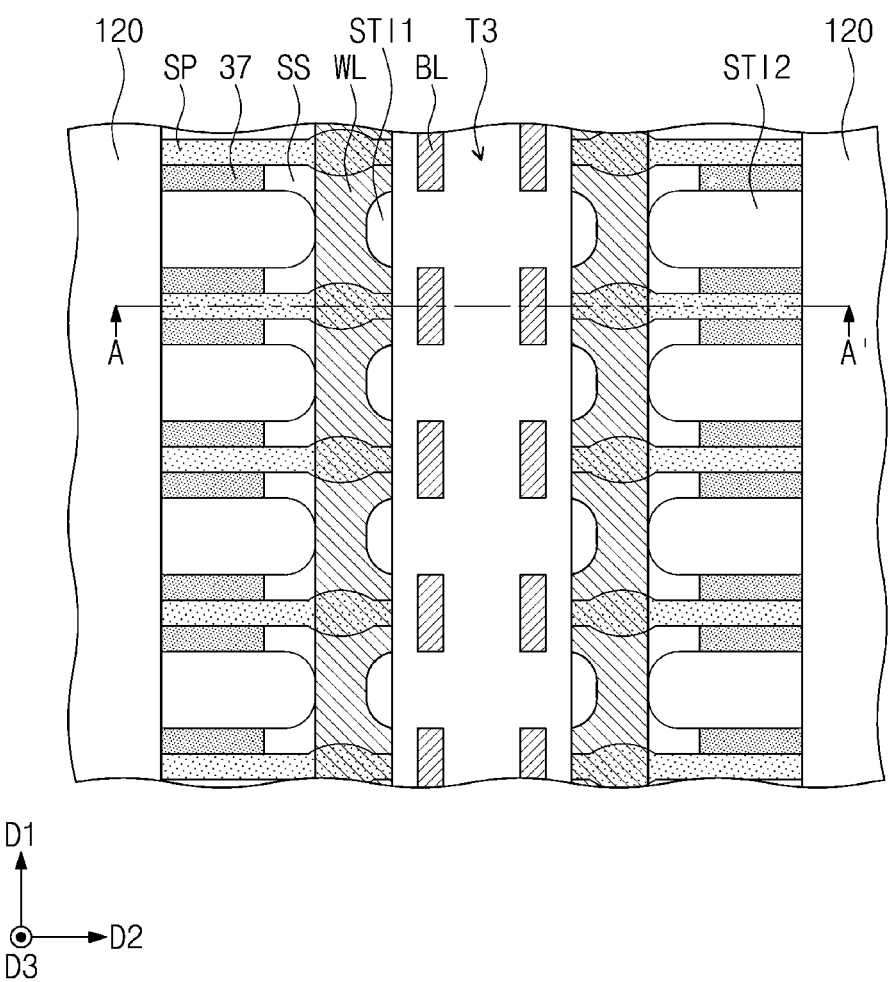
Figure 20B:
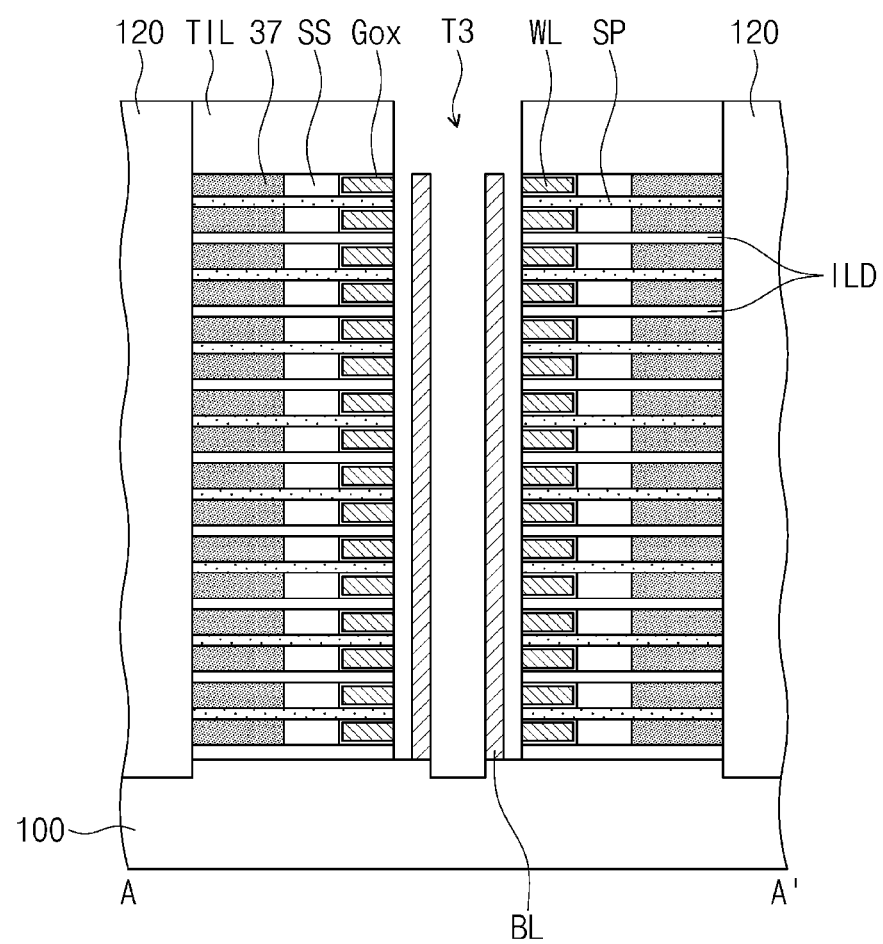
Figure 21A:
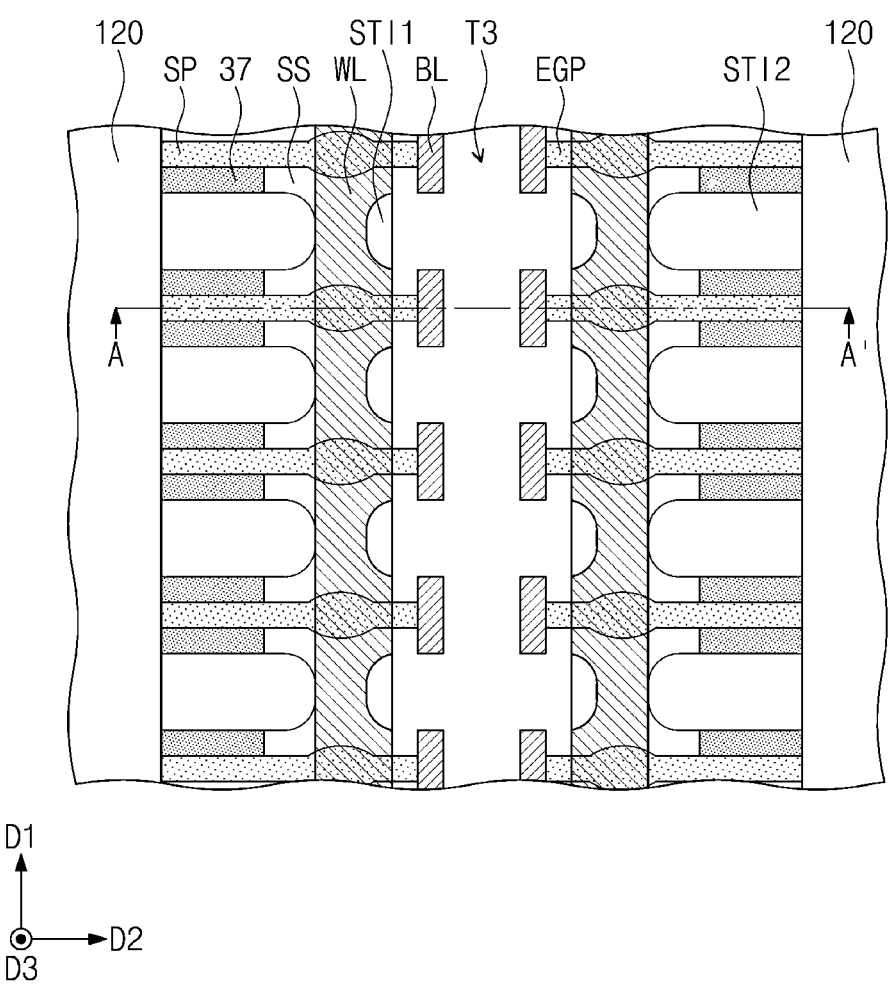
Figure 21B:
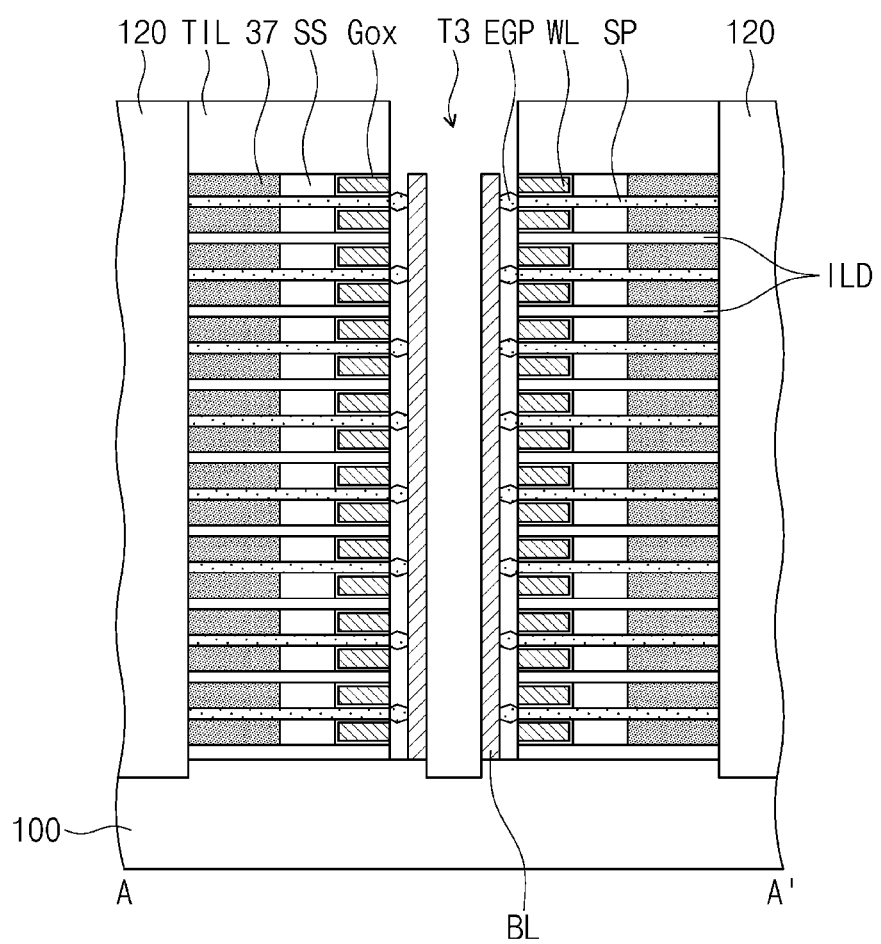

FIGS. 20A and 21A are plan views illustrating a method of fabricating a semiconductor memory device, according to embodiments of the present inventive concept. FIGS. 20B and 21B are cross-sectional views illustrating a method of fabricating a semiconductor memory device according to embodiments of the present inventive concept and in particular illustrating cross-sections taken along lines A-A' of FIGS. 20A to 21A, respectively. Hereinafter, the fabrication method according to this embodiment will be described in more detail with reference to FIGS. 20A to 21B. The steps described with reference to FIGS. 7A to 15C are the same in the fabrication method according to these embodiments, and thus, steps performed after the steps of FIGS. 15A to 15C will be described in more detail below.

Referring to FIGS. 20A and 20B, a plurality of the bit lines BL may be formed in the third trench T3. The bit lines BL may be spaced apart from each other in the first and second directions D1 and D2. In an embodiment, the formation of the bit lines BL may include forming a conductive layer to fill the third trench T3 and performing a patterning process on the conductive layer.

Referring to FIGS. 21A and 21B, the epitaxial patterns EGP may be formed between the bit lines BL and the semiconductor patterns SP (e.g., in the second direction D2). The epitaxial patterns EGP may directly contact a side surface of each of the bit lines BL.

FIGS. 22A to 24A are plan views illustrating method of fabricating a semiconductor memory device, according to embodiment of the present inventive concept. FIGS. 22B to 24B are cross-sectional views illustrating a method of fabricating a semiconductor memory device according to embodiments of the present inventive concept and in particular illustrating cross-sections taken along lines A-A' of FIGS. 22A to 24A, respectively. Hereinafter, the fabrication methods according to these embodiments will be described in more detail with reference to FIGS. 22A to 24B. The steps described with reference to FIGS. 7A to 15C are the same in the fabrication method according to these embodiments, and thus, steps performed after the steps of FIGS. 15A to 15C will be described in more detail below.

Figure 22A:
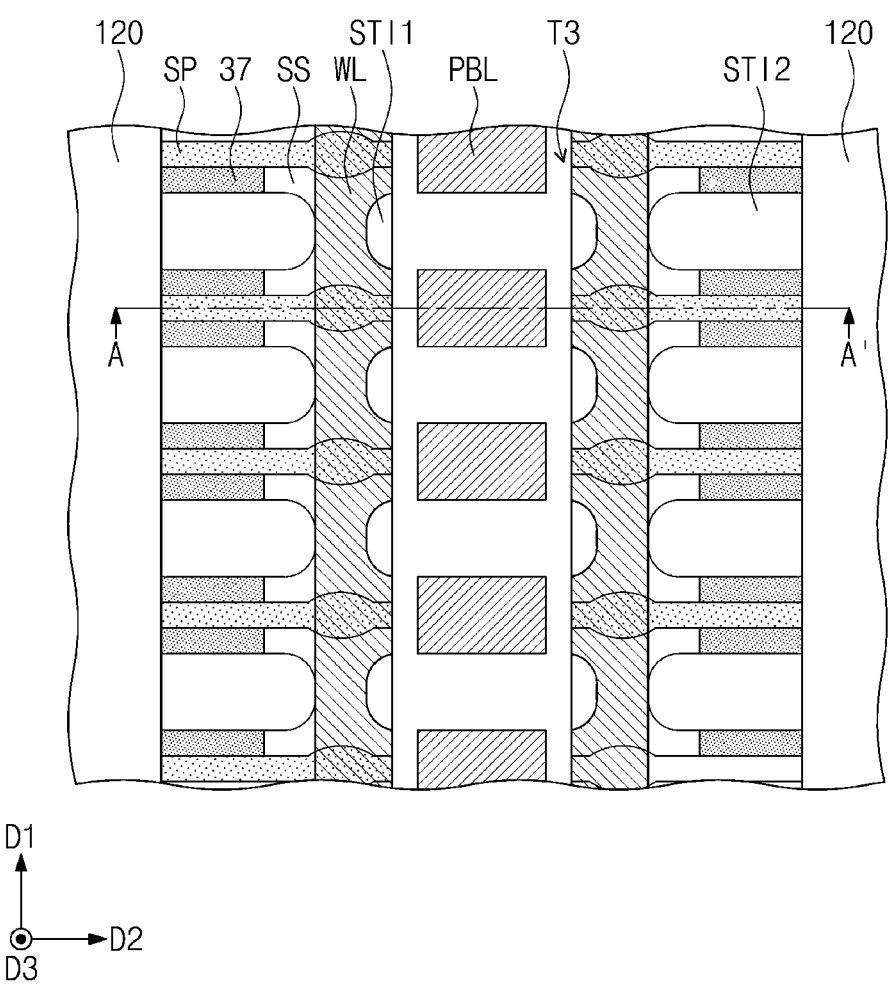
Figure 22B:
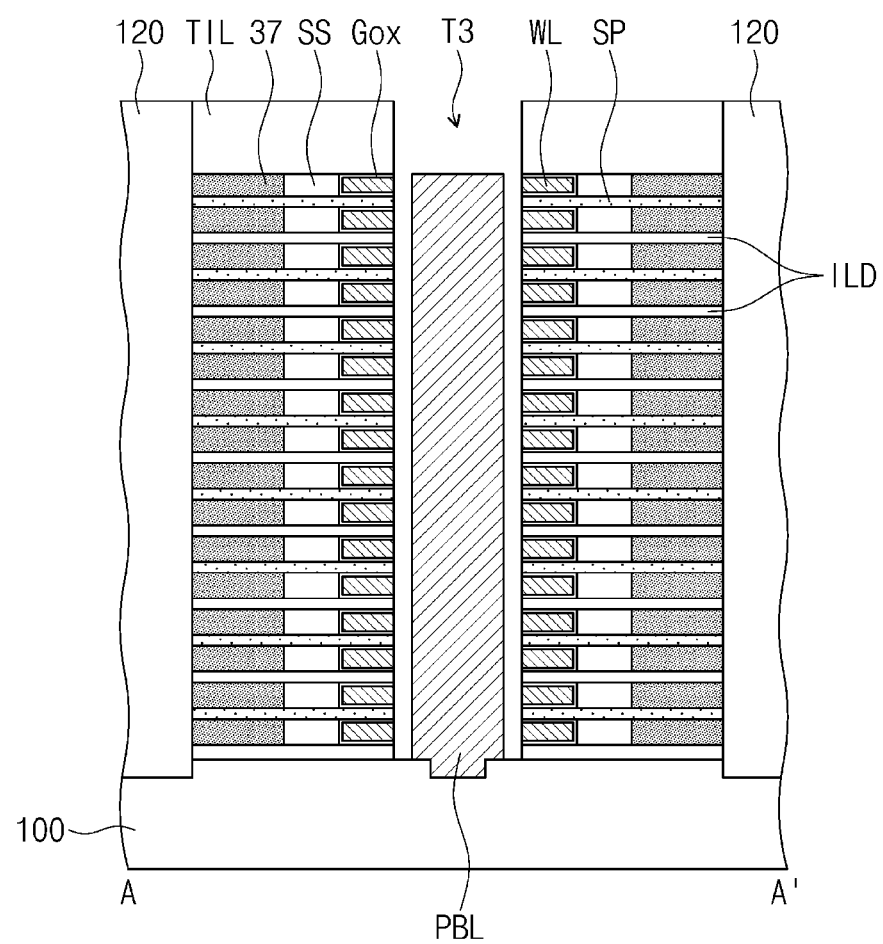

Referring to FIGS. 22A and 22B, a preliminary bit line PBL may be formed in the third trench T3. The word lines WL, which are disposed at both sides of the preliminary bit line PBL (e.g., in the second direction D2), may be arranged in the third direction D3, and in this embodiment, a distance from the preliminary bit line PBL to the word lines WL on the left side (e.g., in the second direction D2) may be substantially equal to a distance from the preliminary bit line PBL to the word lines WL on the right side (e.g., in the second direction D2).

Figure 23A:
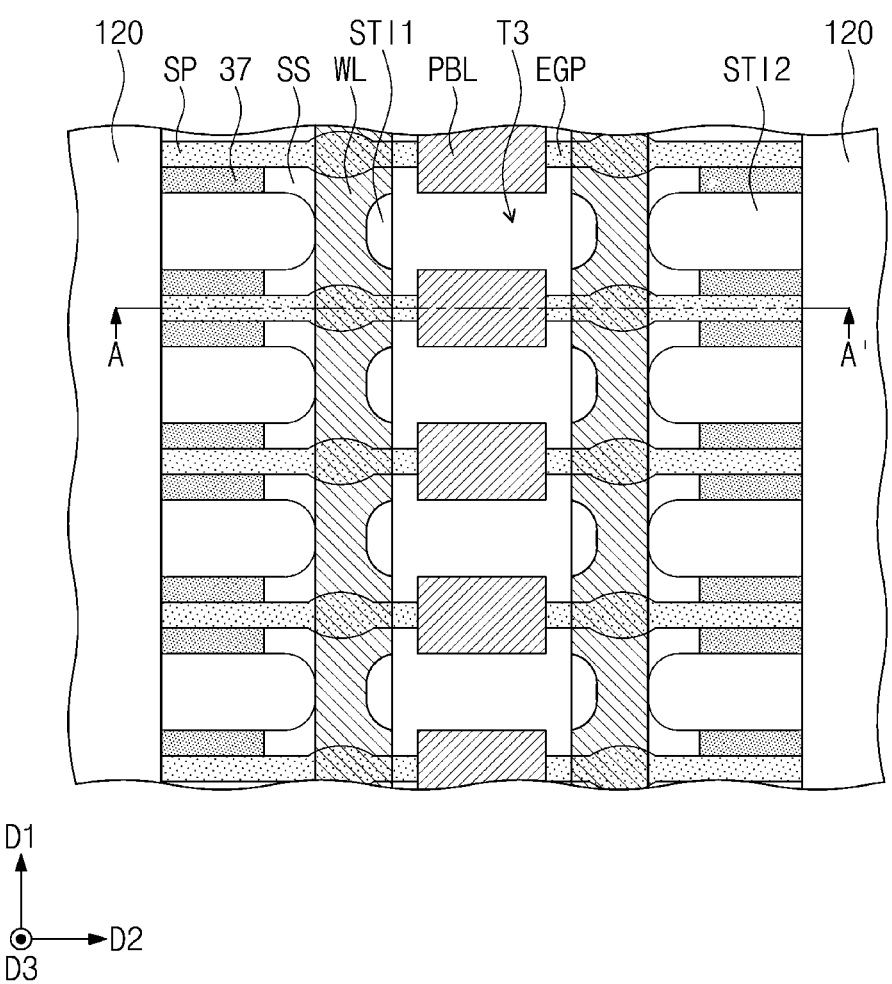
Figure 23B:
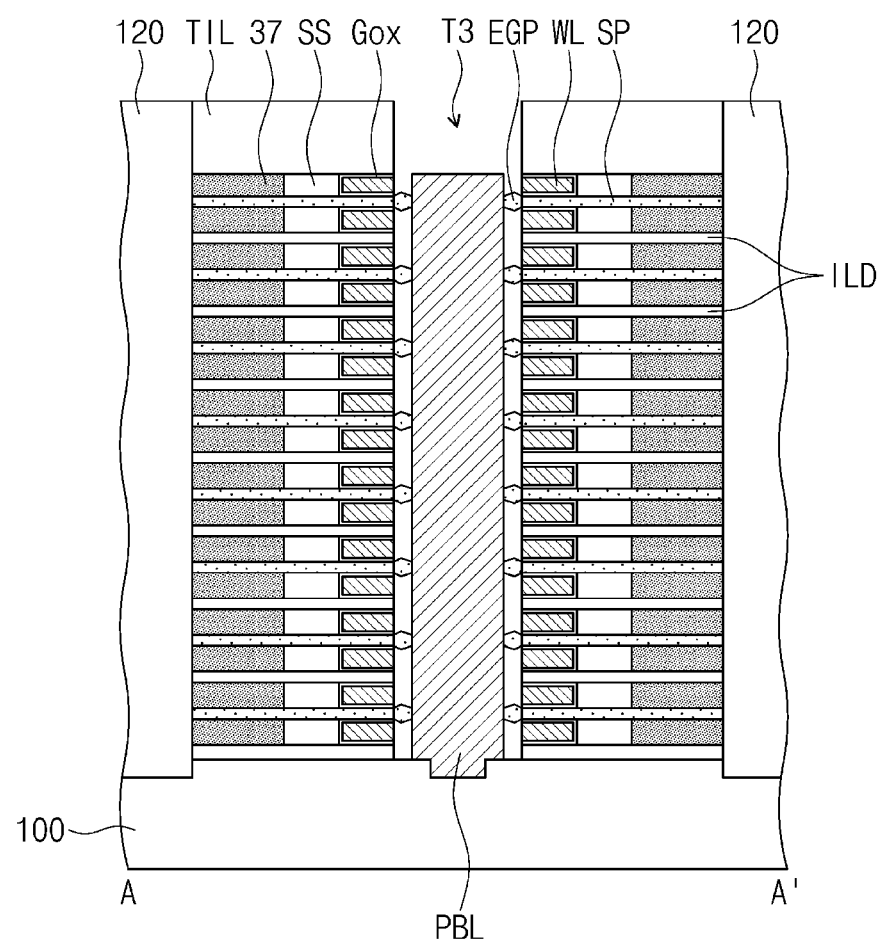

Referring to FIGS. 23A and 23B, the epitaxial patterns EGP may be formed between the preliminary bit line PBL and the semiconductor patterns SP (e.g., in the second direction D2). The epitaxial patterns EGP may directly contact a side surface of the preliminary bit line PBL.

Figure 24A:
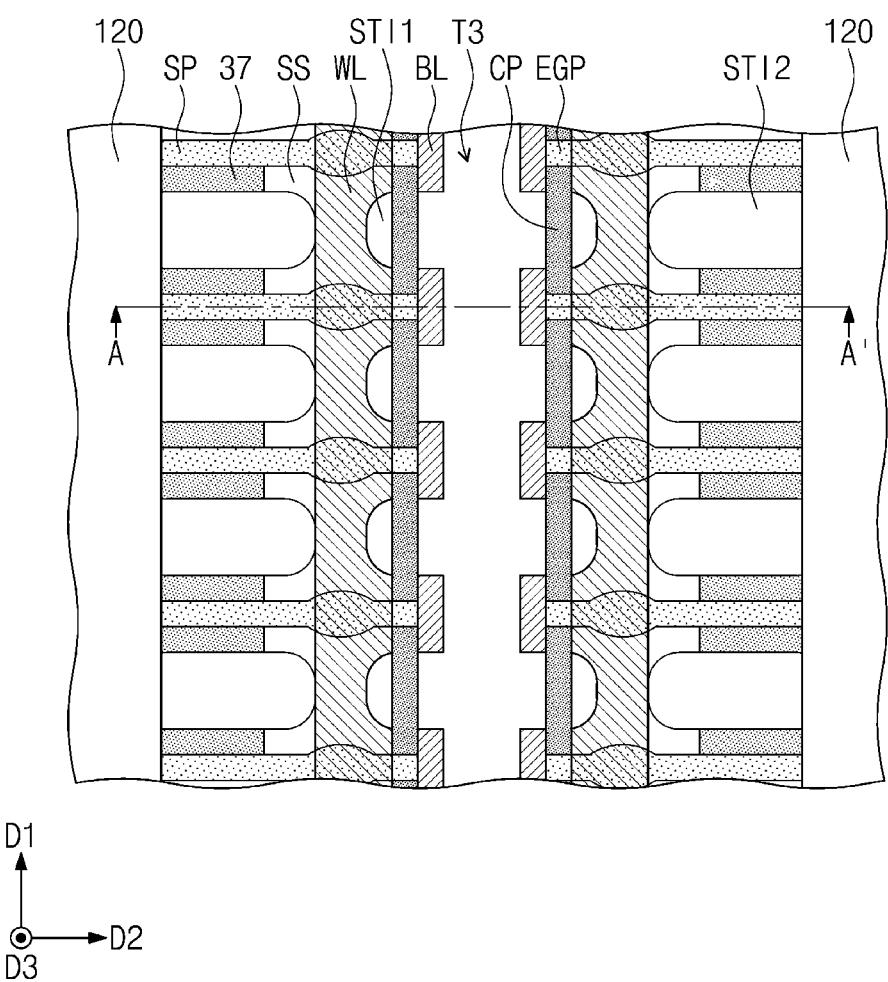
Figure 24B:
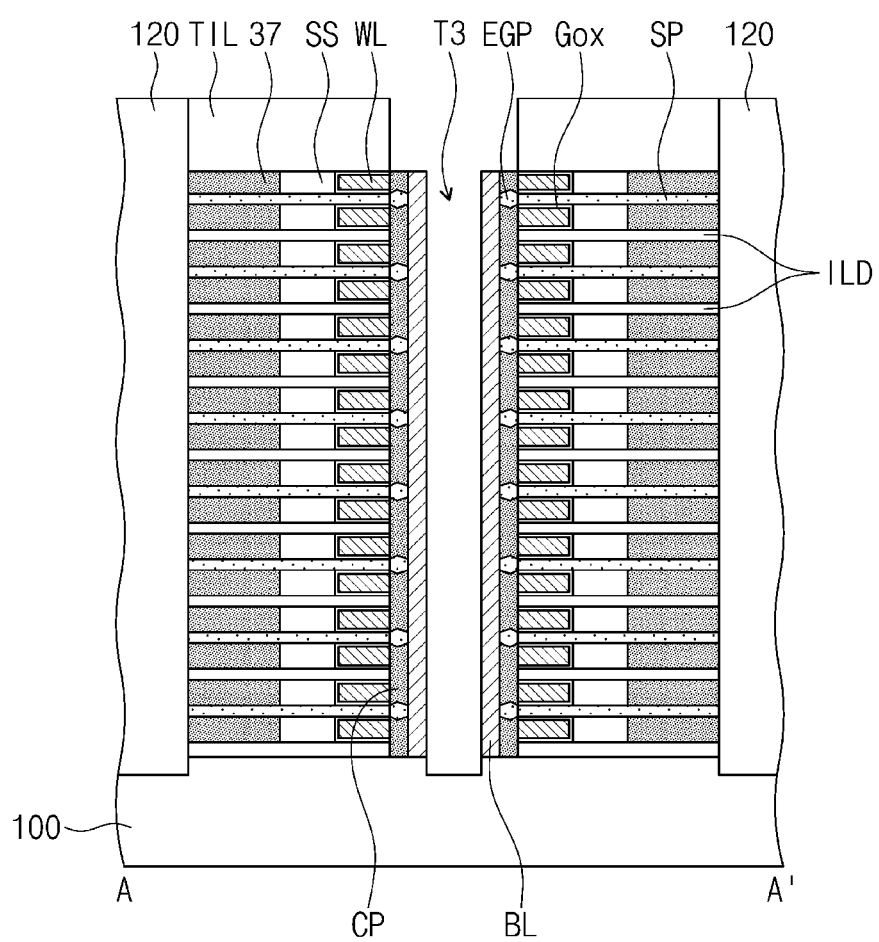

Referring to FIGS. 24A and 24B, a patterning process may be performed on the preliminary bit line PBL. Accordingly, the bit lines BL may be formed, and in an embodiment, the bit lines BL may be spaced apart from each other in the first and second directions D1 and D2.

Thereafter, the capping insulating pattern CP may be formed between the word lines WL and the bit lines BL (e.g., in the second direction D2).

In a semiconductor memory device according to an embodiment of the present inventive concept and a method of fabricating the same, word lines may be formed by patterning a preliminary word line using a dry etching process and not using a wet etching process. Accordingly, it may be possible to reduce a variation in lengths of the word lines and thereby to increase reliability and electrical characteristics of the semiconductor memory device.

While non-limiting embodiments of the present inventive concept have been particularly shown and described, it will be understood by one of ordinary skill in the art that variations in form and detail may be made therein without departing from the spirit and scope of the present inventive concept.

What is claimed is:

1. A semiconductor memory device, comprising:
   a stack structure including word lines and interlayer dielectric patterns that are alternately and repeatedly stacked on a semiconductor substrate;
   semiconductor patterns that are respectively disposed between vertically adjacent word lines of the word lines;
   a bit line that vertically extends from the semiconductor substrate and contacts the semiconductor patterns;
   a capping insulating pattern disposed between the bit line and the word lines and covering side surfaces of the interlayer dielectric patterns; and
   memory elements that are respectively disposed between vertically adjacent interlayer dielectric patterns of the interlayer dielectric patterns,
   wherein each of the semiconductor patterns comprises a first source/drain region that contacts the bit line, a second source/drain region that directly contacts one memory element of the memory elements, and a channel region between the first and second source/drain regions, wherein lateral ends of the capping insulating pattern are aligned with lateral ends of the first source/drain region, wherein the semiconductor memory device further comprises a gate insulating layer interposed between the channel region and the word lines, wherein the gate insulating layer directly contacts a side surface of the capping insulating pattern and does not directly contact the first source/drain region, and wherein a largest width of the first source/drain region is greater than a width of the channel region.

2. The semiconductor memory device of claim 1, wherein the bit line is spaced apart from the interlayer dielectric patterns with the capping insulating pattern interposed therebetween.

3. The semiconductor memory device of claim 1, further comprising a silicide pattern, that conformally covers a top surface, a bottom surface, and one side surface of the first source/drain region and directly contacts the bit line.

4. The semiconductor memory device of claim 3, wherein the silicide pattern is electrically separated from the word lines.

5. The semiconductor memory device of claim 1, wherein side surfaces of the capping insulating pattern are substantially perpendicular to a top surface of the substrate.

6. The semiconductor memory device of claim 1, wherein side surfaces of the capping insulating pattern and a first side surface of each of the word lines are inclined at an angle relative to an opposite second side surface of each of the word lines.

7. The semiconductor memory device of claim 6, wherein a width of the capping insulating pattern in a horizontal direction is constant as a vertical distance from the semiconductor substrate is increased.

8. The semiconductor memory device of claim 1, wherein a width of the first source/drain region is greater at a center portion of the first source/drain region than at end portions of the first source/drain region.

9. The semiconductor memory device of claim 1, wherein:
the first source/drain region has a first end portion adjacent to the bit line and a second end portion that directly contacts the channel region; and
a width of the first source/drain region at the first end portion is less than a width of the first source/drain region at the second end portion.

10. The semiconductor memory device of claim 1, wherein the first source/drain region comprises at least one impurity selected from boron (B), carbon (C) and fluorine (F).

11. A semiconductor memory device, comprising:
a stack structure including word lines and interlayer dielectric patterns that are alternately and repeatedly stacked on a semiconductor substrate;
semiconductor patterns that are respectively disposed between vertically adjacent word lines of the word lines, wherein each of the semiconductor patterns comprises a first source/drain region that contact the bit line, a second source/drain region that directly contacts one storage electrode of the storage electrodes, and a channel region between the first and second source/drain regions;
a gate insulating layer interposed between the channel region and the word lines;
a silicide pattern covering a portion of each of the semiconductor patterns;
a bit line that vertically extends from the semiconductor substrate and contacts the semiconductor patterns;
a capping insulating pattern disposed between the bit line and the word lines and covering side surfaces of the interlayer dielectric patterns;
storage electrodes that are respectively disposed between vertically adjacent interlayer dielectric patterns of the interlayer dielectric patterns;
a capacitor dielectric layer conformally covering inner surfaces of the storage electrodes; and
wherein the gate insulating layer directly contacts a side surface of the capping insulating pattern and does not directly contact the first source/drain region, and
wherein the silicide pattern covers a portion of the first source/drain region.

12. The semiconductor memory device of claim 11, wherein the silicide pattern is electrically separated from the word lines.

13. The semiconductor memory device of claim 11, wherein a width of the first source/drain region changes as a distance from the channel region changes.

14. The semiconductor memory device of claim 13, wherein a width of the first source/drain region is greater at a center portion of the first source/drain region than at end portions of the first source/drain regions.

15. The semiconductor memory device of claim 13, wherein:
the first source/drain region has a first end portion adjacent to the bit line and a second end portion that directly contacts the channel region; and
a width of the first source/drain region at the first end portion is less than a width of the first source/drain region at the second end portion.

16. The semiconductor memory device of claim 11, wherein:
the capping insulating pattern comprises protruding portions that protrude toward the word lines; and
top and bottom surfaces of each of the protruding portions are covered with the gate insulating layer.

17. A semiconductor memory device, comprising:
a stack structure including word lines and interlayer dielectric patterns that are alternately stacked on a semiconductor substrate, the word lines extending in a first direction that is parallel to a top surface of the semiconductor substrate;
semiconductor patterns that are disposed on the semiconductor substrate to have a long axis extending in a second direction crossing the word lines and are spaced apart from each other in the first direction and a third direction that is perpendicular to the top surface of the semiconductor substrate;
bit lines that extend in the third direction and are spaced apart from each other in the first direction, each of the bit lines contacts first side surfaces of the semiconductor patterns that are spaced apart from each other in the third direction;
capping insulating patterns that are disposed between the bit lines and the word lines and extend in the third direction to cover side surfaces of the interlayer dielectric patterns;
memory elements that are respectively disposed between vertically adjacent interlayer dielectric patterns of the interlayer dielectric patterns and directly contact second side surfaces of the semiconductor patterns that are opposite to the first side surfaces;

first insulating separation patterns disposed between the bit lines and are spaced apart from each other in the first direction; and second insulating separation patterns disposed between the memory elements and are spaced apart from each other in the first direction, wherein each of the semiconductor patterns comprises a first source/drain region that contacts one bit line of the bit lines, a second source/drain region that directly contacts one memory element of the memory elements, and a channel region between the first and second source/drain regions, and a largest width of the first source/drain region is larger than a width of the channel region.

18. The semiconductor memory device of claim 17, wherein each of the word lines is provided to fully surround the channel region of each of the semiconductor patterns.

* * * * *